US011139237B2

(12) United States Patent
Shao et al.

(10) Patent No.: US 11,139,237 B2
(45) Date of Patent: Oct. 5, 2021

(54) THREE-DIMENSIONAL MEMORY DEVICE CONTAINING HORIZONTAL AND VERTICAL WORD LINE INTERCONNECTIONS AND METHODS OF FORMING THE SAME

(71) Applicant: SANDISK TECHNOLOGIES LLC, Addison, TX (US)

(72) Inventors: Shiqian Shao, Fremont, CA (US); Jee-Yeon Kim, San Jose, CA (US); Fumiaki Toyama, Cupertino, CA (US); Hirofumi Tokita, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/547,971

(22) Filed: Aug. 22, 2019

(65) Prior Publication Data
US 2021/0057336 A1 Feb. 25, 2021

(51) Int. Cl.
*H01L 27/115* (2017.01)
*H01L 23/522* (2006.01)
(Continued)

(52) U.S. Cl.
CPC .......... *H01L 23/5226* (2013.01); *G11C 5/063* (2013.01); *H01L 23/5283* (2013.01);
(Continued)

(58) Field of Classification Search
None
See application file for complete search history.

(56) References Cited

U.S. PATENT DOCUMENTS 5,915,167 A 6/1999 Leedy
8,951,859 B2 2/2015 Higashitani et al.
(Continued)

FOREIGN PATENT DOCUMENTS

JP 2012-119478 6/2012

OTHER PUBLICATIONS

USPTO Office Communication, Non-Final Office Action, for U.S. Appl. No. 16/675,459, dated Nov. 17, 2020, 11 pages.
(Continued)

*Primary Examiner* — Daniel Whalen
(74) *Attorney, Agent, or Firm* — The Marbury Law Group PLLC

(57) ABSTRACT

A method of forming a three-dimensional memory device includes forming a vertically alternating sequence of insulating layers and spacer material layers over a substrate, where the spacer material layers are formed as, or are subsequently replaced with, electrically conductive layers, forming multiple sets of stepped surfaces in terrace regions of the vertically alternating sequence, forming memory stack structures through memory array regions of the vertically alternating sequence, and forming a metal interconnect structure which electrically connects a portion of a topmost electrically conductive layer in the first memory array region and a portion of a topmost electrically conductive layer in the second memory array region, and which extends above a horizontal plane of the topmost electrically conductive layer in the first memory array region and a portion of a topmost electrically conductive layer in the second memory array region.

6 Claims, 31 Drawing Sheets

(51) Int. Cl.
  *G11C 5/06* (2006.01)
  *H01L 23/528* (2006.01)
  *H01L 27/11519* (2017.01)
  *H01L 27/11582* (2017.01)
  *H01L 27/11556* (2017.01)
  *H01L 27/11565* (2017.01)
  *H01L 27/1157* (2017.01)
  *H01L 27/11524* (2017.01)

(52) U.S. Cl.
  CPC .... *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(56) References Cited

U.S. PATENT DOCUMENTS

| | | | |
|---|---|---|---|
| 9,019,775 B2 | 4/2015 | Costa et al. | |
| 9,142,304 B2 | 9/2015 | Costa et al. | |
| 9,224,747 B2 | 12/2015 | Mizutani et al. | |
| 9,450,023 B1 | 9/2016 | Konevecki et al. | |
| 9,515,084 B2 | 12/2016 | Oh et al. | |
| 9,589,981 B2 | 3/2017 | Nishikawa et al. | |
| 9,613,975 B2 | 4/2017 | Huang et al. | |
| 9,646,981 B2 | 5/2017 | Nishikawa et al. | |
| 9,679,906 B2 | 6/2017 | Lu et al. | |
| 9,721,663 B1 | 8/2017 | Ogawa et al. | |
| 9,905,573 B1 | 2/2018 | Mada et al. | |
| 10,186,520 B2 | 1/2019 | Iguchi | |
| 10,192,877 B2 | 1/2019 | Norizuki et al. | |
| 10,256,245 B2 | 4/2019 | Ariyoshi | |
| 10,269,620 B2 | 4/2019 | Yu et al. | |
| 10,290,803 B2 | 5/2019 | Sano et al. | |
| 2008/0101664 A1 | 5/2008 | Perez | |
| 2009/0182449 A1 | 7/2009 | Frei et al. | |
| 2010/0207186 A1 | 8/2010 | Higashi et al. | |
| 2010/0219560 A1 | 9/2010 | Campbell | |
| 2012/0132983 A1* | 5/2012 | Fukuzumi | H01L 29/7926 257/324 |
| 2013/0130468 A1 | 5/2013 | Higashitani et al. | |
| 2013/0279257 A1 | 10/2013 | Costa et al. | |
| 2014/0027838 A1 | 1/2014 | Kido et al. | |
| 2014/0284675 A1 | 9/2014 | Watanabe | |
| 2014/0300597 A1 | 10/2014 | Holcomb | |
| 2015/0061068 A1 | 3/2015 | Akutsu et al. | |
| 2015/0170748 A1 | 6/2015 | Costa et al. | |
| 2015/0279852 A1* | 10/2015 | Mizutani | H01L 27/11524 257/315 |
| 2016/0111361 A1 | 4/2016 | Oh et al. | |
| 2016/0147973 A1 | 5/2016 | Holcomb | |
| 2016/0300885 A1 | 10/2016 | Konevecki et al. | |
| 2016/0322376 A1 | 11/2016 | Lee | |
| 2016/0365351 A1 | 12/2016 | Nishikawa et al. | |
| 2016/0365352 A1 | 12/2016 | Nishikawa et al. | |
| 2017/0077139 A1 | 3/2017 | Iguchi | |
| 2017/0236746 A1 | 8/2017 | Yu et al. | |
| 2017/0243650 A1 | 8/2017 | Ogawa et al. | |
| 2017/0352678 A1* | 12/2017 | Lu | H01L 21/4846 |
| 2018/0061850 A1 | 3/2018 | Mada et al. | |
| 2018/0102281 A1 | 4/2018 | Yang | |
| 2018/0158873 A1 | 6/2018 | Sano et al. | |
| 2018/0261611 A1 | 9/2018 | Norizuki et al. | |
| 2018/0261613 A1 | 9/2018 | Ariyoshi | |
| 2019/0139974 A1 | 5/2019 | Sugawara et al. | |
| 2019/0221574 A1 | 7/2019 | Shimabukuro et al. | |

OTHER PUBLICATIONS

Endoh, T. et al., "Novel Ultra High Density Flash Memory with A Stacked-Surrounding Gate Transistor (S-GT) Structured Cell," IEDM Proc., pp. 33-36, (2001).
U.S. Appl. No. 15/950,356, filed Apr. 11, 2018, SanDisk Technologies LLC.
U.S. Appl. No. 16/362,988, filed Mar. 25, 2019, SanDisk Technologies LLC.

* cited by examiner

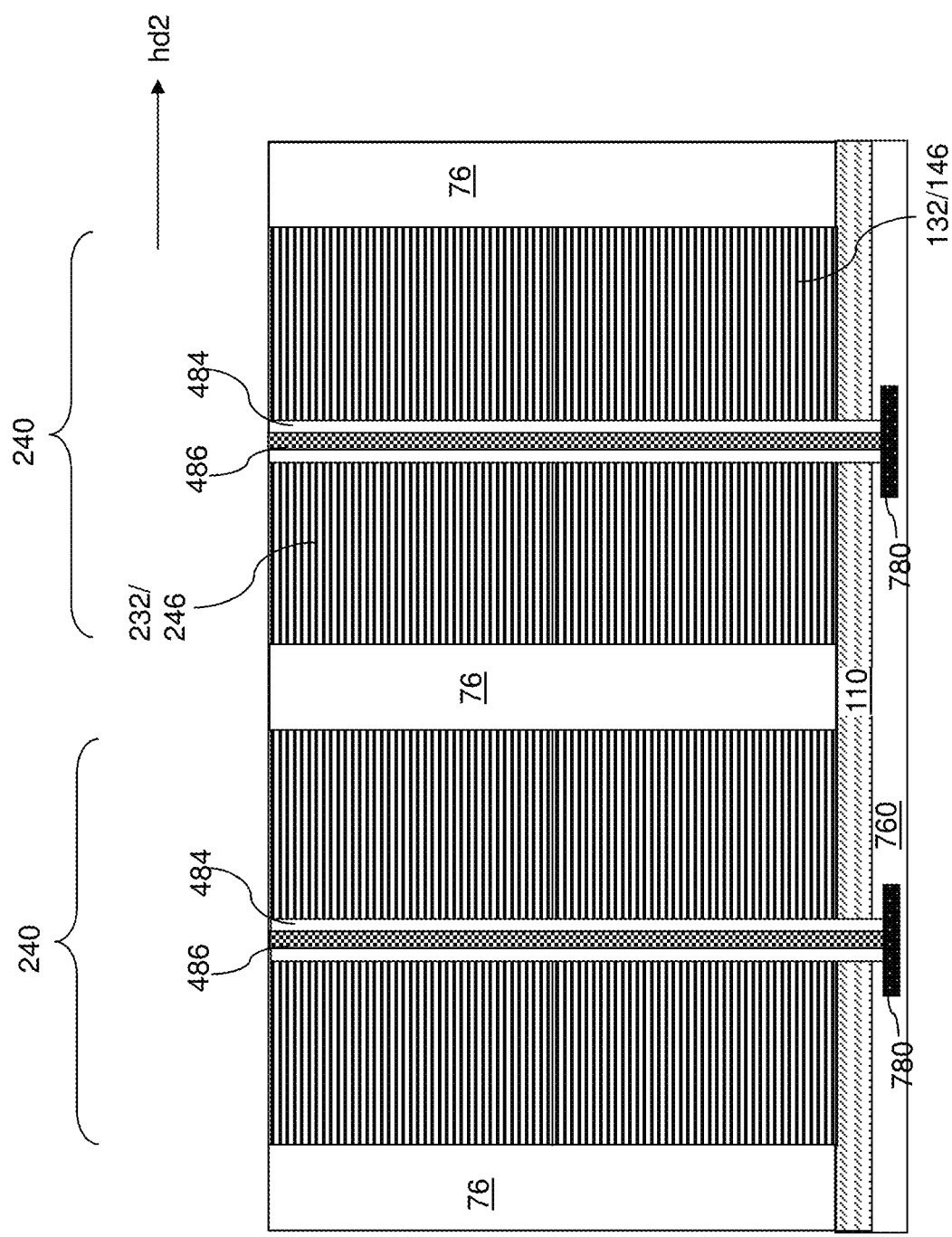

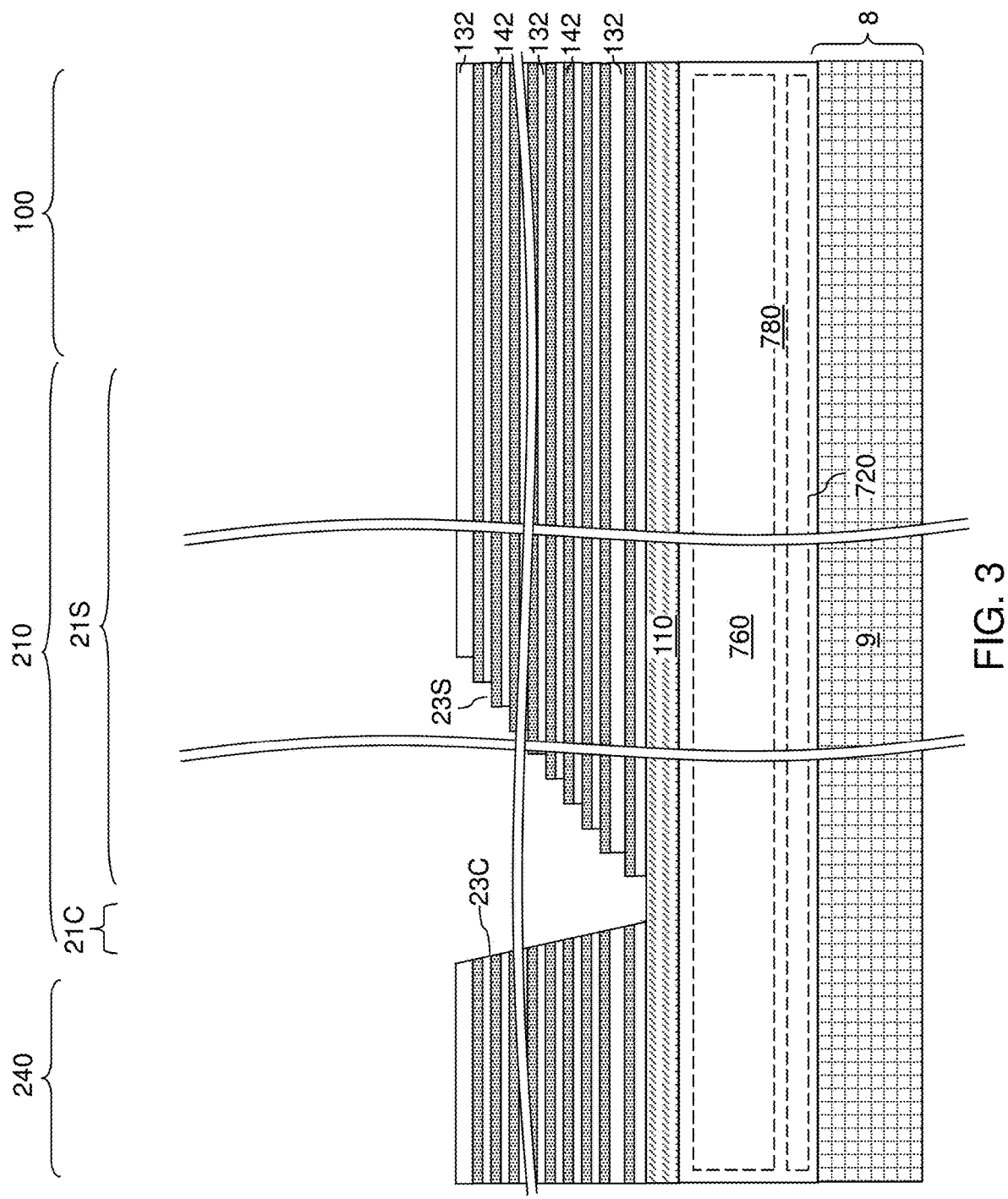

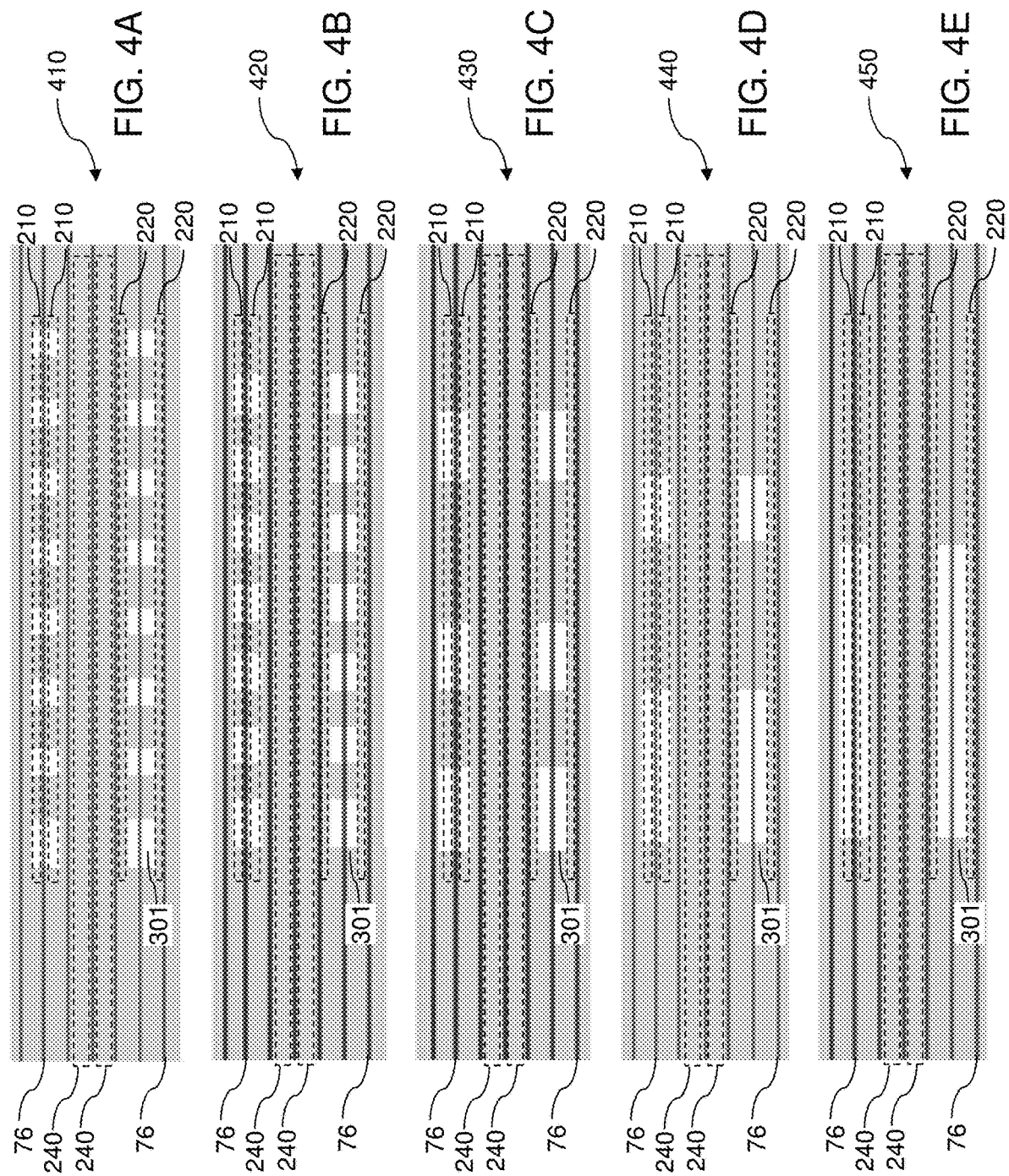

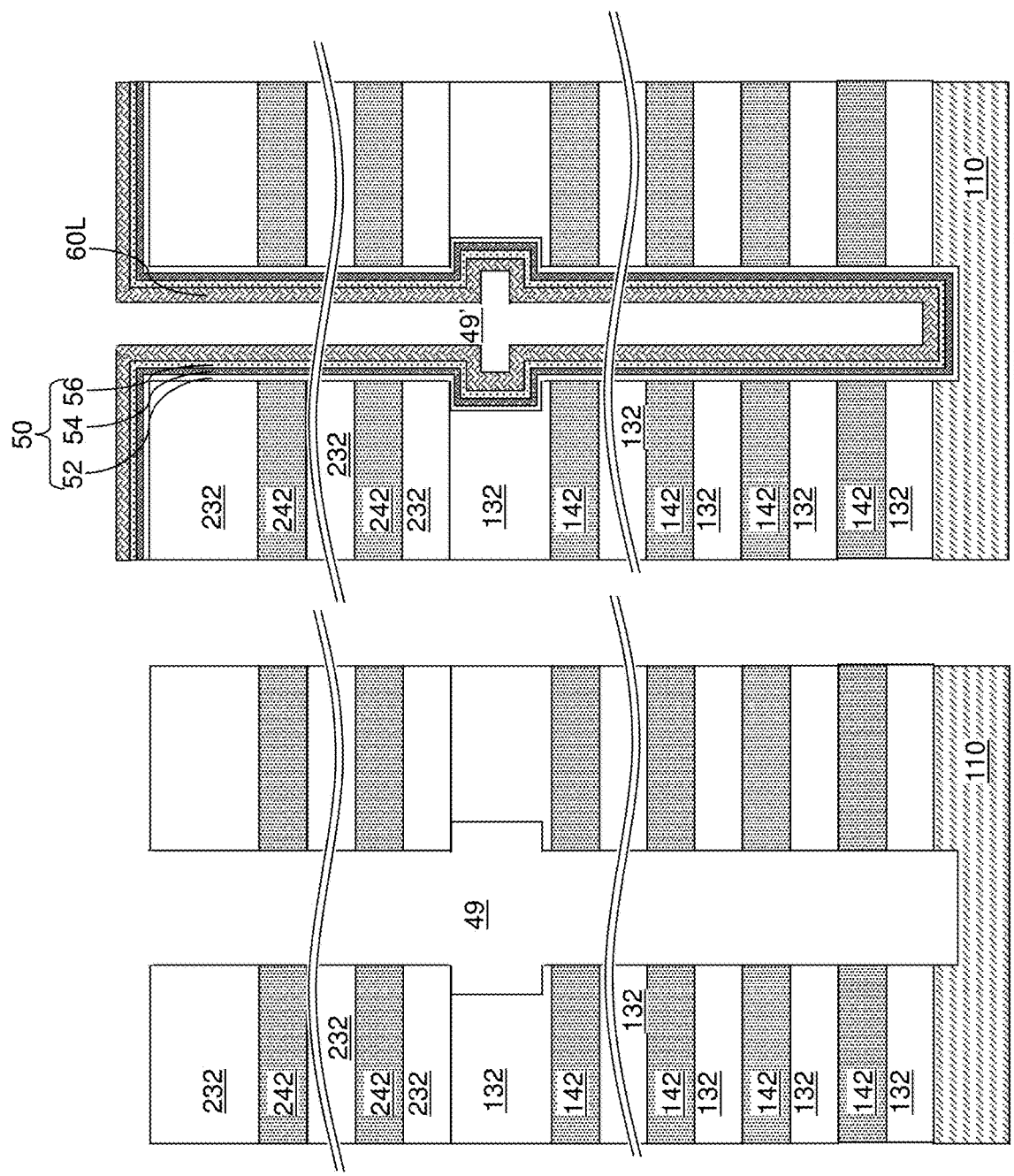

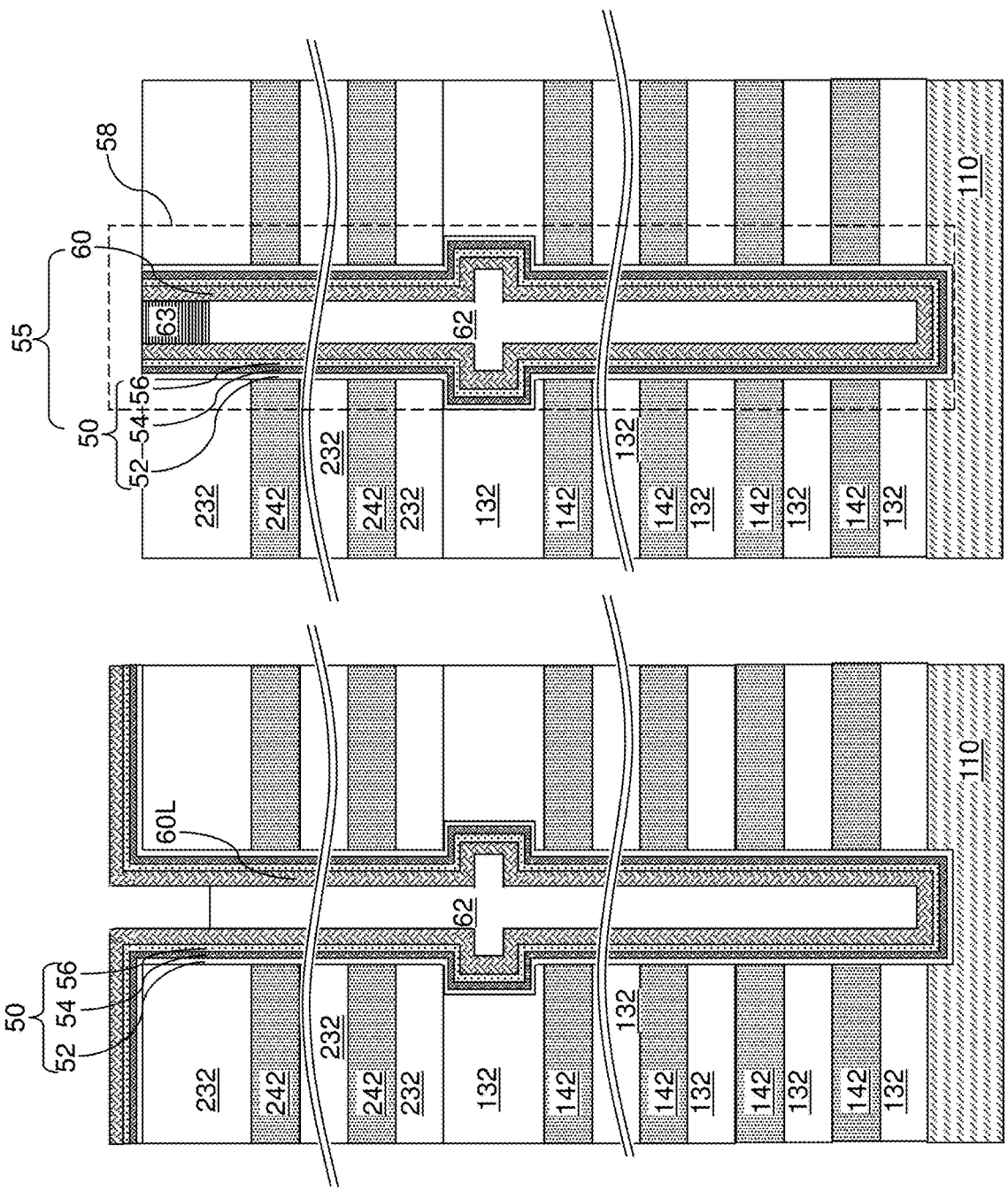

THREE-DIMENSIONAL MEMORY DEVICE CONTAINING HORIZONTAL AND VERTICAL WORD LINE INTERCONNECTIONS AND METHODS OF FORMING THE SAME

FIELD

The present disclosure relates generally to the field of semiconductor devices, and particular to a three-dimensional memory device with horizontal and vertical word line interconnections and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a three-dimensional memory device is provided, which comprises: forming a vertically alternating sequence of insulating layers and spacer material layers over a substrate, wherein the spacer material layers are formed as, or are subsequently replaced with, electrically conductive layers; forming multiple sets of stepped surfaces in terrace regions of the vertically alternating sequence by iteratively performing a set of layer patterning processing steps at least twice, wherein the set of layer patterning processing steps comprises a patterned photoresist material layer formation step in which a respective patterned photoresist material layer with a respective array of openings therein is formed over the vertically alternating sequence, and a pattern transfer step in which a pattern in the respective patterned photoresist material layer is transferred through a respective number of layers within the vertically alternating sequence; forming a dielectric material portion on each of the multiple sets of stepped surfaces of the vertically alternating sequence in each of the terrace regions; forming memory stack structures through memory array regions of the vertically alternating sequence in which all layers of the vertically alternating sequence are present; and forming a metal interconnect structure which electrically connects a portion of a topmost electrically conductive layer in the first memory array region and a portion of a topmost electrically conductive layer in the second memory array region, and which extends above a horizontal plane of the topmost electrically conductive layer in the first memory array region and a portion of a topmost electrically conductive layer in the second memory array region.

According to another embodiment of the present disclosure, a three-dimensional memory device is provided, which comprises: alternating stacks of insulating layers and electrically conductive layers located over a substrate, wherein the alternating stacks are laterally spaced apart among one another by line trenches that laterally extend along a first horizontal direction; and memory stack structures extending through memory array regions of the alternating stacks in which all layers of a respective one of the alternating stacks are present, wherein each alternating stack comprises: a first memory array region including a respective first subset of the memory stack structures; a second memory array region including a respective second subset of the memory stack structures and laterally spaced from the first memory array region along a first horizontal direction; and a terrace region including a set of stepped surfaces and located between the first memory array region and the second memory array region, wherein the set of stepped surfaces comprises at least one forward staircase area in which a vertical step of an overlying electrically conductive layer is more proximal to the first memory array region than a vertical step of an underlying electrically conductive layer is to the first memory array region for a vertically neighboring pair of electrically conductive layers, and at least one reverse staircase area in which a vertical step of an overlying electrically conductive layer is less proximal to the first memory array region than a vertical step of an underlying electrically conductive layer is to the first memory array region for a vertically neighboring pair of electrically conductive layers.

According to yet another aspect of the present disclosure, a three-dimensional memory device is provided, which comprises: alternating stacks of insulating layers and electrically conductive layers located over a substrate, wherein the alternating stacks are laterally spaced apart among one another by line trenches that laterally extend along a first horizontal direction; and memory stack structures extending through memory array regions of the alternating stacks in which all layers of a respective one of the alternating stacks are present, wherein each alternating stack comprises: a first memory array region including a respective first subset of the memory stack structures; a second memory array region including a respective second subset of the memory stack structures and laterally spaced from the first memory array region along a first horizontal direction; a terrace region including a set of stepped surfaces and located between the first memory array region and the second memory array region; and an array interconnection region adjoined to, and is laterally offset along a second horizontal direction from, the terrace region, wherein: portions of a first subset of the electrically conductive layers in the array interconnection region provide electrically conductive paths between the first memory array region and the second memory array region; a second subset of the electrically conductive layers is electrically disconnected within the array interconnection region between the first memory array region and the second memory array region by stepped surfaces; and electrical connection between the first memory array region and the second memory array region is provided by a respective set of at least two contact via structures and at least one metal line structure for each electrically conductive layer within the second subset of the electrically conductive layers.

BRIEF DESCRIPTION OF THE DRAWINGS

FIG. 1E is a schematic vertical cross-sectional view of the exemplary structure of region M2 along the along the vertical plane E-E' of FIG. 1C.

FIG. 3 is a vertical cross-sectional view of a first configuration of the exemplary structure after formation of stepped surfaces in the terrace regions according to an embodiment of the present disclosure.

FIGS. 4A-4E are top-down views of patterned photoresist material layers that can be sequentially used to form stepped surfaces in the terrace regions of a second configuration exemplary structure of FIG. 2. Locations of line trenches to be subsequently formed are juxtaposed on the top-down views of the patterned photoresist material layers.

FIGS. 13A-13D illustrate sequential vertical cross-sectional views of a memory opening during formation of a memory opening fill structure according to an embodiment of the present disclosure.

DETAILED DESCRIPTION

Figure 1A:
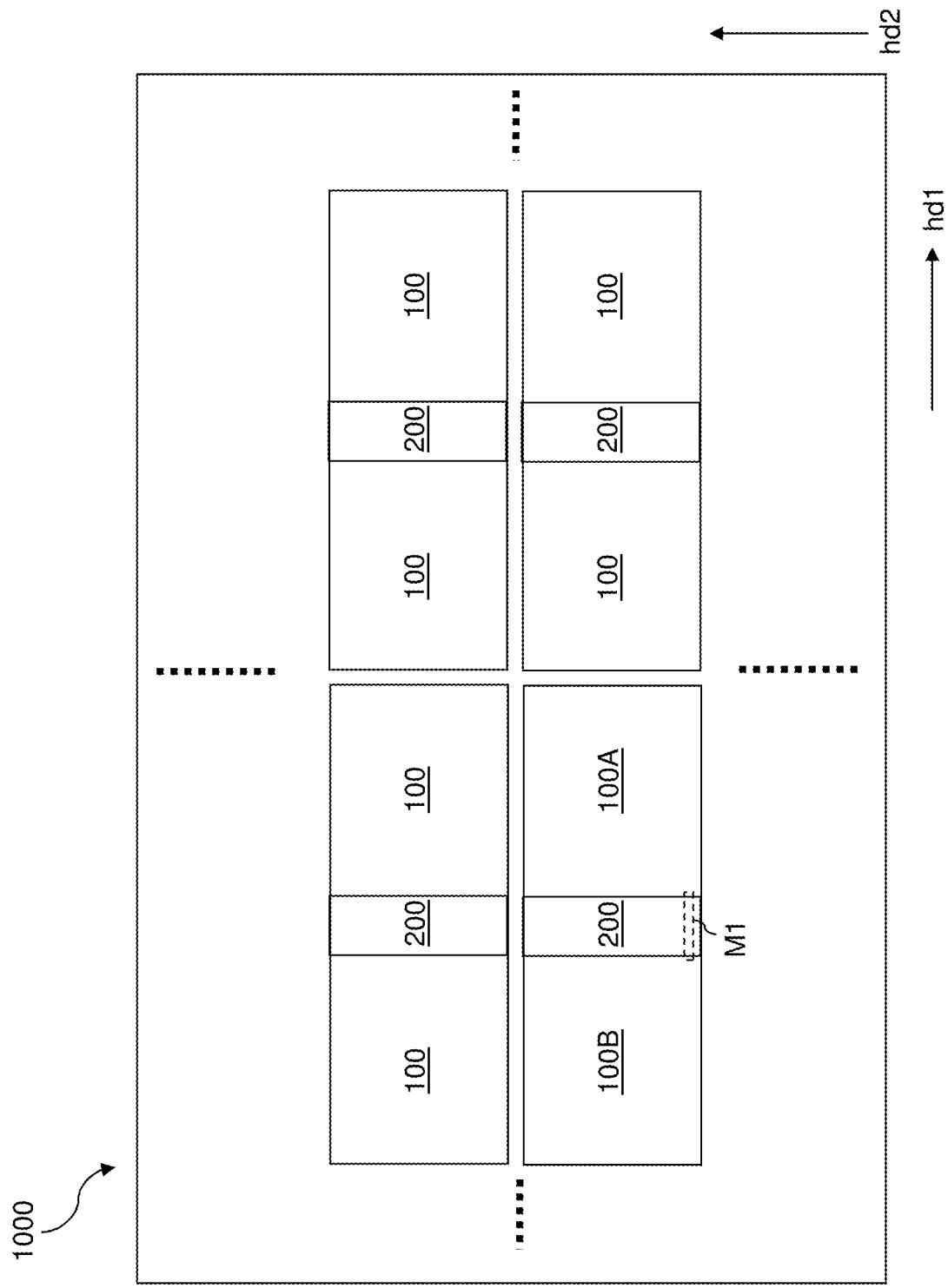
FIG. 1A is a plan view of a semiconductor die including multiple three-dimensional memory array regions of embodiments of the present disclosure.

As discussed above, the embodiments of the present disclosure are directed to a three-dimensional memory device containing both horizontal and vertical word line interconnections and methods of forming the same without requiring a hard mask.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^7$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^7$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1F, a semiconductor die 1000 including multiple three-dimensional memory array regions and terrace regions is illustrated in various views. The semiconductor die 1000 can include multiple planes, each of which includes two memory array regions 100, such as first and second memory array regions (100A, 100B), spaced apart by a respective inter-array region 200. Generally, a semiconductor die 1000 may include a single plane or multiple planes. The total number of planes in the semiconductor die 1000 may be selected based on performance requirements on the semiconductor die 1000. A pair of memory array regions 100 in a plane may be laterally spaced apart along a first horizontal direction (e.g., word line direction) hd1. A second horizontal direction (e.g., bit line direction) hd2 can be perpendicular to the first horizontal direction hd1.

Each memory array region 100 includes at least one vertically alternating sequence of insulating layers and electrically conductive layers (e.g., word lines). Each vertically alternating sequence of insulating layers and electrically conductive layers is herein referred to as an alternating stack. In case multiple alternating stacks are vertically stacked, the bottommost alternating stack is herein referred to as a first alternating stack, the alternating stack immediately overlying the first alternating stack is herein referred to as a second vertically alternating sequence, and so on. The first alternating stack can include first insulating layers 132 and first electrically conductive layers 146, the second vertically alternating sequence can include second insulating layers 232 and second electrically conductive layers 246, and so on. In case multiple alternating stacks are vertical stacked, memory openings extending through a respective alternating stack can be vertically stacked with an areal overlap to form an inter-tier memory opening. Each inter-tier memory opening can vertically extend through multiple alternating stacks. Memory opening fill structures can be formed in each inter-tier memory opening. Each memory opening fill structure includes a vertical semiconductor channel and a memory film. The memory film can include a layer stack including a tunneling dielectric layer, a charge storage layer (such as a silicon nitride layer), and optionally a blocking dielectric layer. Each contiguous combination of a vertical semiconductor channel and a memory film constitutes a memory stack structure.

The alternating stacks of insulating layers (132, 232) and electrically conductive layers (146, 246) can be formed by providing in-process alternating stacks of continuous insulating layers and continuous sacrificial material layers (which may contain silicon nitride or a semiconductor material that can be removed selective to the material of the continuous insulating layers) that extend over all areas of the memory array regions 100 and the inter-array regions 200, by dividing the in-process alternating stacks into multiple alternating stacks of insulating layers (132, 232) and sacrificial material layers that are laterally spaced apart by line trenches that laterally extend along the first horizontal direction hd1 and laterally spaced apart among one another along the second horizontal direction hd2, and by replacing remaining portions of the sacrificial material layers with electrically conductive layers (146, 246) through the line trenches.

Figure 1B:
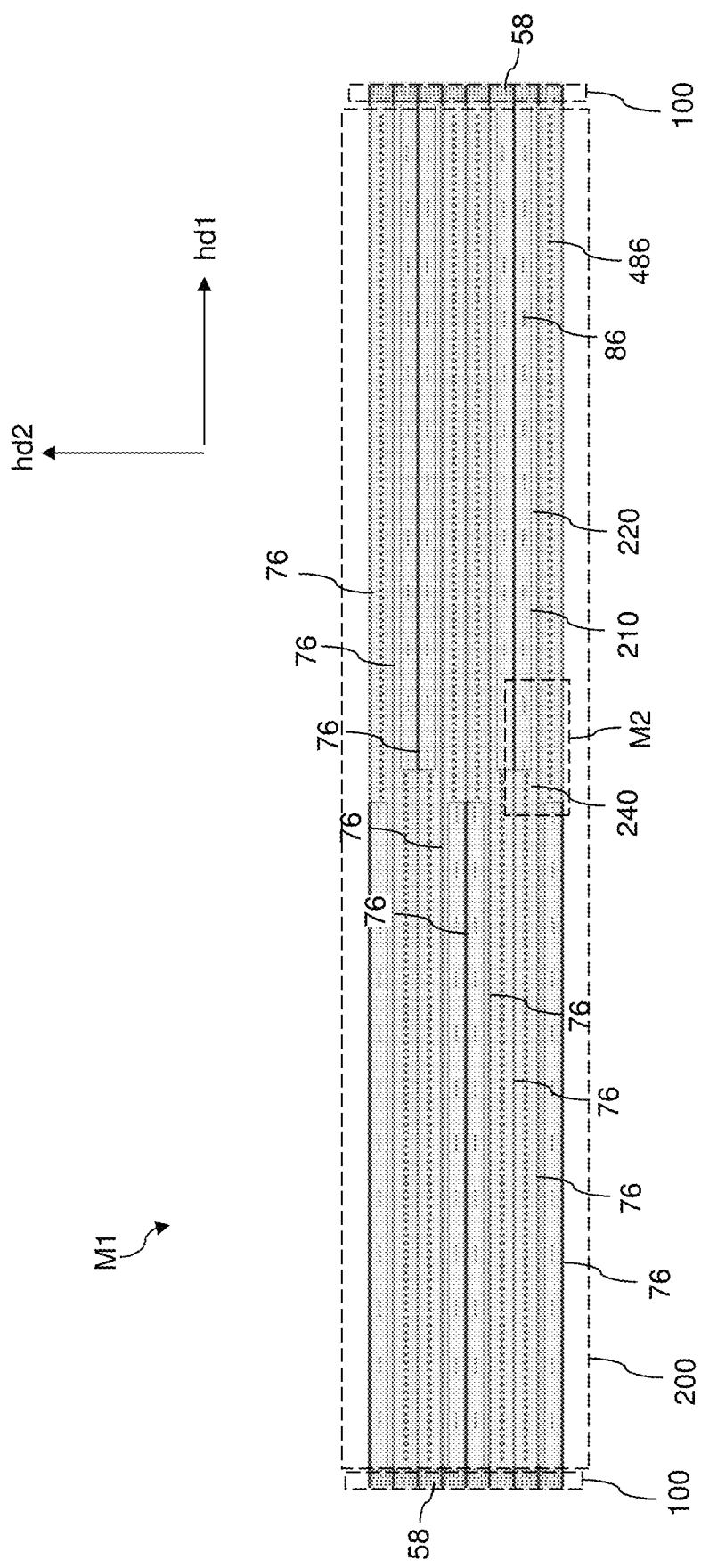
FIG. 1B is a magnified view of region M1 of FIG. 1A.
Figure 1C:
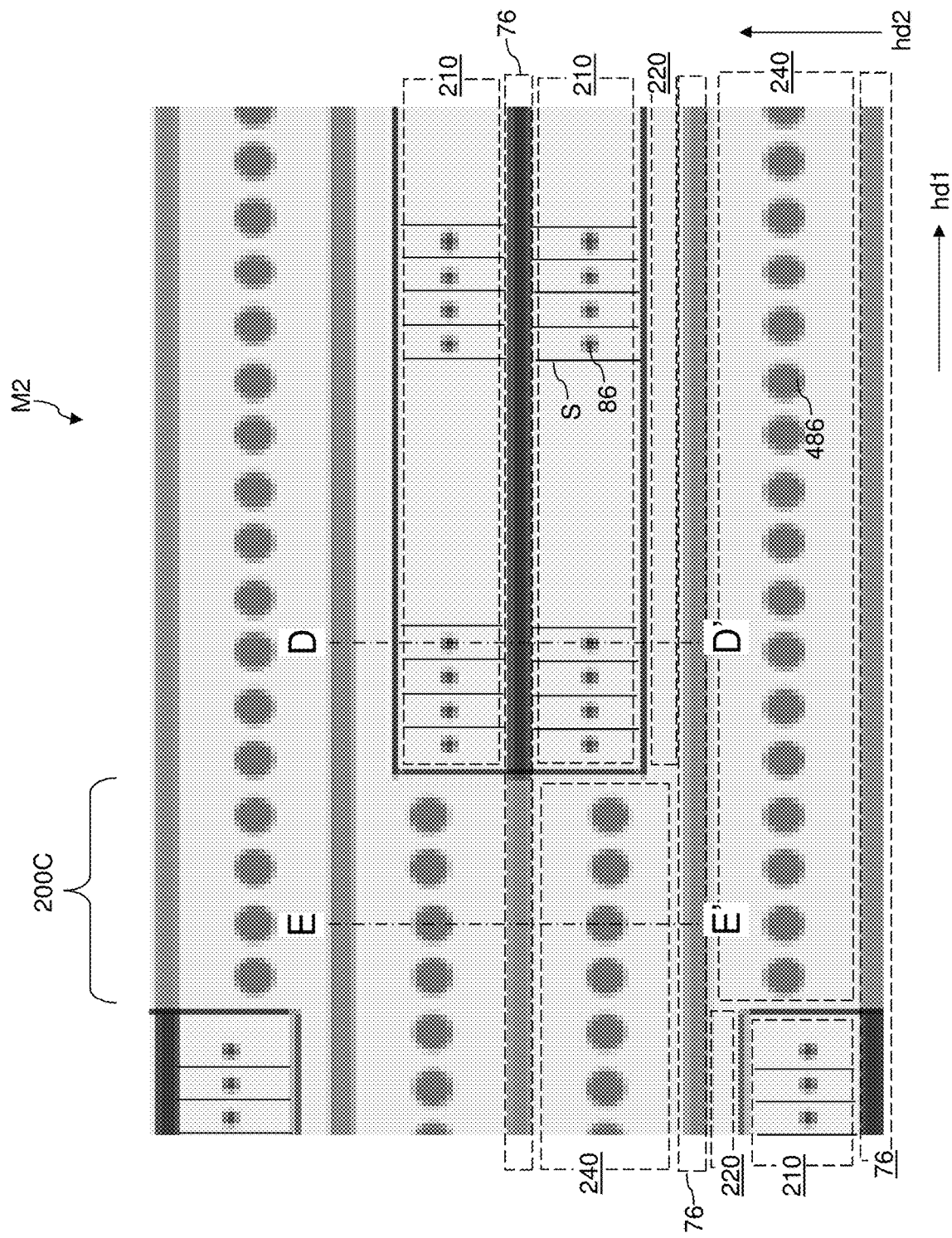
FIG. 1C is a magnified view of region M2 of FIG. 1B.
Figure 1D:
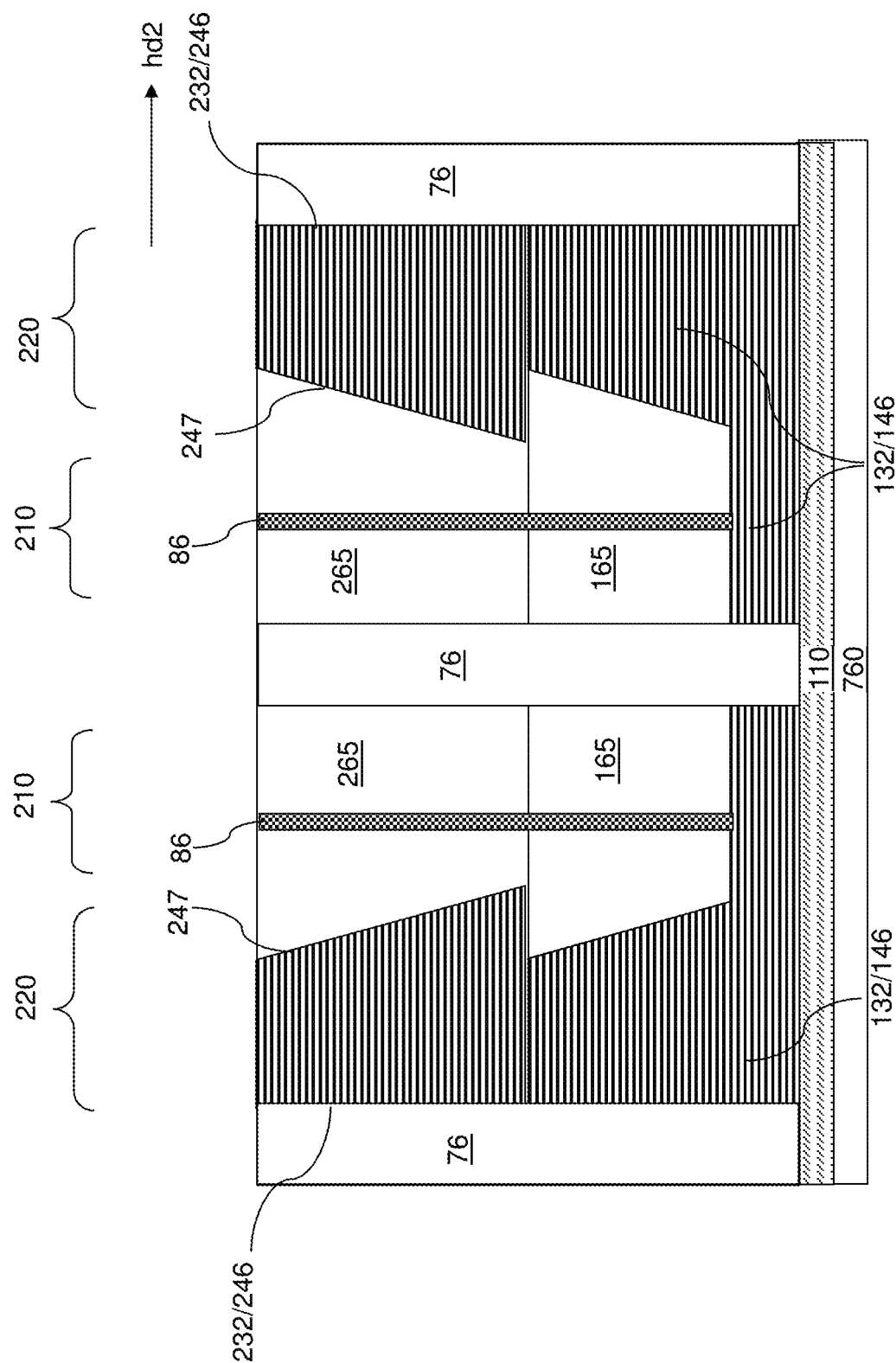
FIG. 1D is a schematic vertical cross-sectional view of an exemplary structure of part of region M2 along the vertical plane D-D' of FIG. 1C.
Figure 1F:
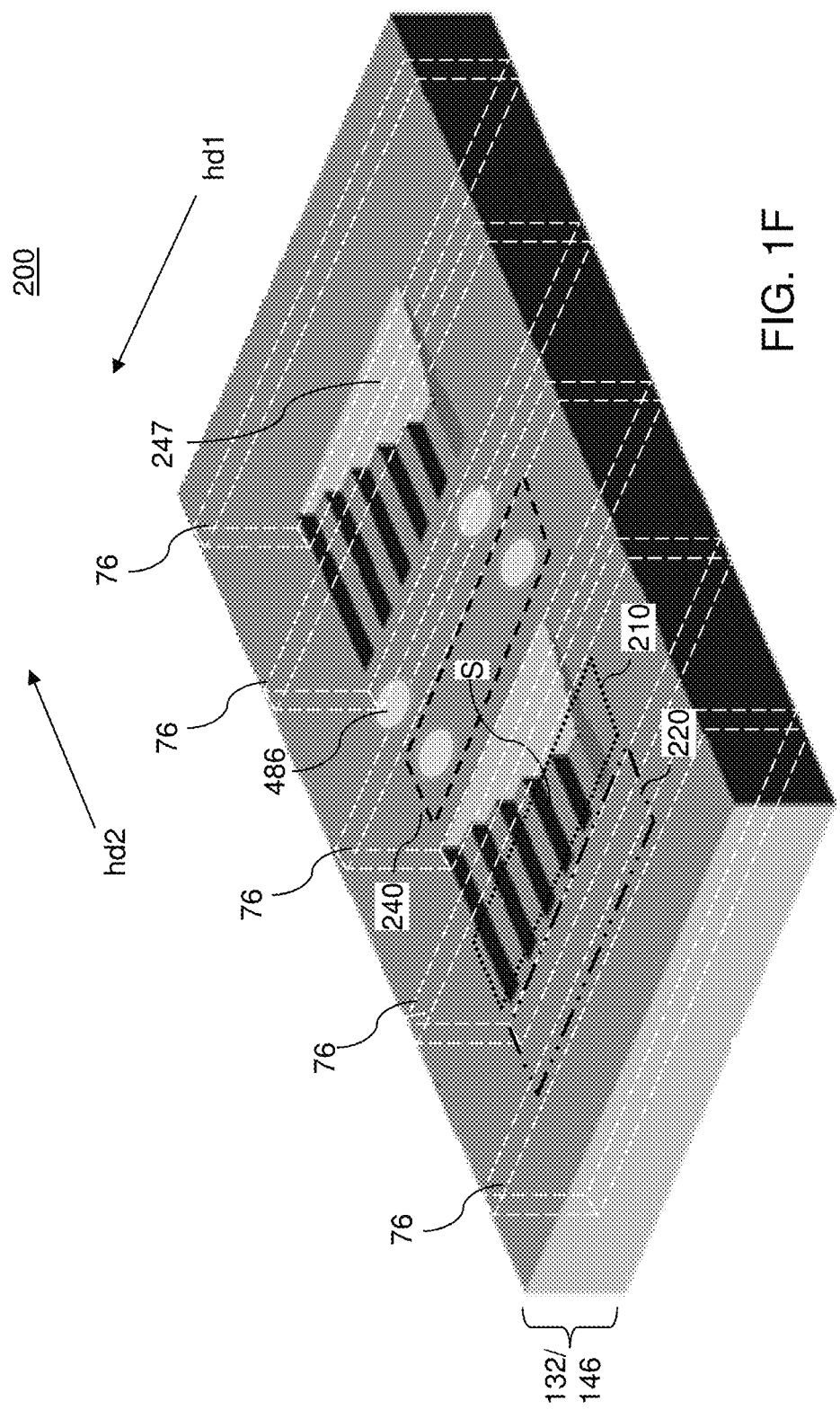
FIG. 1F is a perspective view of a portion of the exemplary structure that includes two neighboring pairs of terrace regions in a semiconductor die of FIG. 1A.

As shown in FIGS. 1D to 1F, the line trenches can be filled with a dielectric material such as silicon oxide to form dielectric wall structures 76. Each dielectric wall structure 76 can be located between a respective laterally neighboring sets of alternating stacks of insulating layers (132, 232) and electrically conductive layers (146, 246). Each dielectric wall structure 76 can vertically extend from a semiconductor material layer 110 that overlies an underlying material layer (such as lower-level dielectric material layers 760) to a topmost surface of the alternating stacks (132, 146, 232, 246). Each dielectric wall structure 76 can laterally extend through the entirety length of an inter-array region 200 and through the entire length of each of the two memory array regions 100 that are adjoined to the inter-array region 200. Each dielectric wall structure 76 can have a respective uniform width along the second horizontal direction hd2. In one embodiment, an optional source local interconnect (e.g., source electrode) may extend through the respective dielectric wall structure 76 to a source region located in the semiconductor material layer 110. Not all of the dielectric wall structures 76 are shown in FIG. 1F for clarity.

As shown in FIGS. 1B, 1C and 1F, each portion of the inter-array region 200 located between a neighboring pair of dielectric wall structures 76 can include a terrace region 210 and an array interconnection region (e.g., "bridge" region) 220, or a vertical interconnection via region 240 when viewed in the second horizontal direction hd2. The end of the vertical interconnection via region 240 may be adjacent to respective end of the pair of the terrace region 210 and the array interconnection region 220, when viewed in the first horizontal direction hd1, as shown in FIG. 1C. Each terrace region 210 includes stepped surfaces that includes vertical steps S that are laterally spaced among one another along the first horizontal direction hd1. The stepped surfaces may have different configurations depending on the various embodiments of the present disclosure, which are further described in more detail below.

The electrically conductive layers (146, 246) of the alternating stacks are disconnected along the first horizontal direction hd1 in the terrace region 210 located in the inter-array region 200 between a neighboring pair of memory array regions 100 to provide stepped surfaces (i.e., steps "S") within each terrace region 210. However, the a lower subset of lower electrically conductive layers (146, 246) of alternating stacks continuously extend between the neighboring pair of memory array regions 100 in the inter-array region 200 along the first horizontal direction hd1 through each array interconnection region 220 between the terrace regions 210 and a dielectric wall structure 76. The first portions of the lower electrically conductive layers within each array interconnection region 220 provide electrical connection between the second portions of the lower electrically conductive layers located in two memory array regions 100 that are laterally spaced apart by the inter-array region 200 and located between a respective neighboring pair of dielectric wall structures 76. Thus, the lower electrically conductive layers (146, 246) of the alternating stacks are electrically connected along the first horizontal direction hd1 between a neighboring pair of memory array regions 100 through the array interconnection region (e.g., "bridge" region) 220. In contrast, an upper subset containing one or more upper electrically conductive layers (146, 246) of the alternating stacks are not electrically connected along the first horizontal direction hd1 between a neighboring pair of memory array regions 100 in the array interconnection region (e.g., "bridge" region) 220, as will be described in more detail below.

As shown in FIG. 1D, at least one dielectric material portion (such as a first retro-stepped dielectric material portion 165 and/or a second retro-stepped dielectric material portion 265) can be formed in each terrace region 210. As used herein, a "retro-stepped" element refers to an element having stepped surfaces at a bottom portion thereof. Layer contact via structures (e.g., word line contact via structures) 86 can be formed through the dielectric material portion(s) (such as the first retro-stepped dielectric material portion 165 and/or the second retro-stepped dielectric material portion 265) to provide electrical contact to a respective electrically conductive layer (e.g., word line) (146, 246). Each layer contact via structures 86 contacts a horizontal surface (i.e., step "S") shown in FIGS. 1C, 1D and IF within a set of stepped surfaces of the alternating stacks (132, 146, 232, 246) provided in the terrace regions 210.

As shown in FIG. 1D, the inner surfaces 247 of the alternating stacks (132, 146, 232, 246) in the array interconnection regions 220 may be tapered, due to the inherent taper of the etch process. Each inner surface 247 may contact a respective dielectric material portion (165, 265). The inner surfaces 247 may have an average taper angle (as measured from a vertical direction) that is less than 45 degrees. The taper angle may be in a range from 10 degrees to 40 degrees, such as from 15 degrees to 30 degrees.

The vertical interconnection via region 240 can include all layers of within the alternating stacks located between a respective neighboring pair of dielectric wall structures 76 and can laterally extend along the second horizontal direction hd2 between a neighboring pair of dielectric walls structures 76. Laterally-isolated vertical interconnection structures (484, 486) can be formed through the alternating stacks (132, 146, 232, 246) in the vertical interconnection via regions 240. Each laterally-isolated vertical interconnection structures (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E.

As shown in FIGS. 1B and 1C, a pair of terrace regions 210 can adjoin a dielectric wall structure 76, and may have a same lateral extent along the first horizontal direction hd1. Multiple pairs of terrace regions 210 may be arranged along the second horizontal direction hd2 such that each strip of alternating stacks located between a neighboring pair of dielectric wall structures 76 includes a respective terrace region 210. Pairs of terrace regions 210 may be laterally staggered with different offsets along the first horizontal direction hd1 for every other pair of terrace regions 210 that are arranged along the second horizontal direction 210. For example, every odd-numbered pairs of terrace regions 210 may be more proximal to a first memory array region 100 that is adjoined to the first end (e.g., left end) of the inter-array region 200, and every even-numbered pairs of terrace regions 210 may be more proximal to a second memory array region 100 that is adjoined to the second end (e.g., right end) of the inter-array region 200. The lateral offset along the first horizontal direction hd1 for the terrace regions 210 may be selected such that a center portion 200C of the inter-array region 200 includes an area that includes only vertical interconnection via regions 240 between each neighboring pair of dielectric wall structures 76, as shown in FIG. 1C. The center portion 200C of the inter-array region 200 may be equidistant from each of the memory array regions 100.

Figure 2:
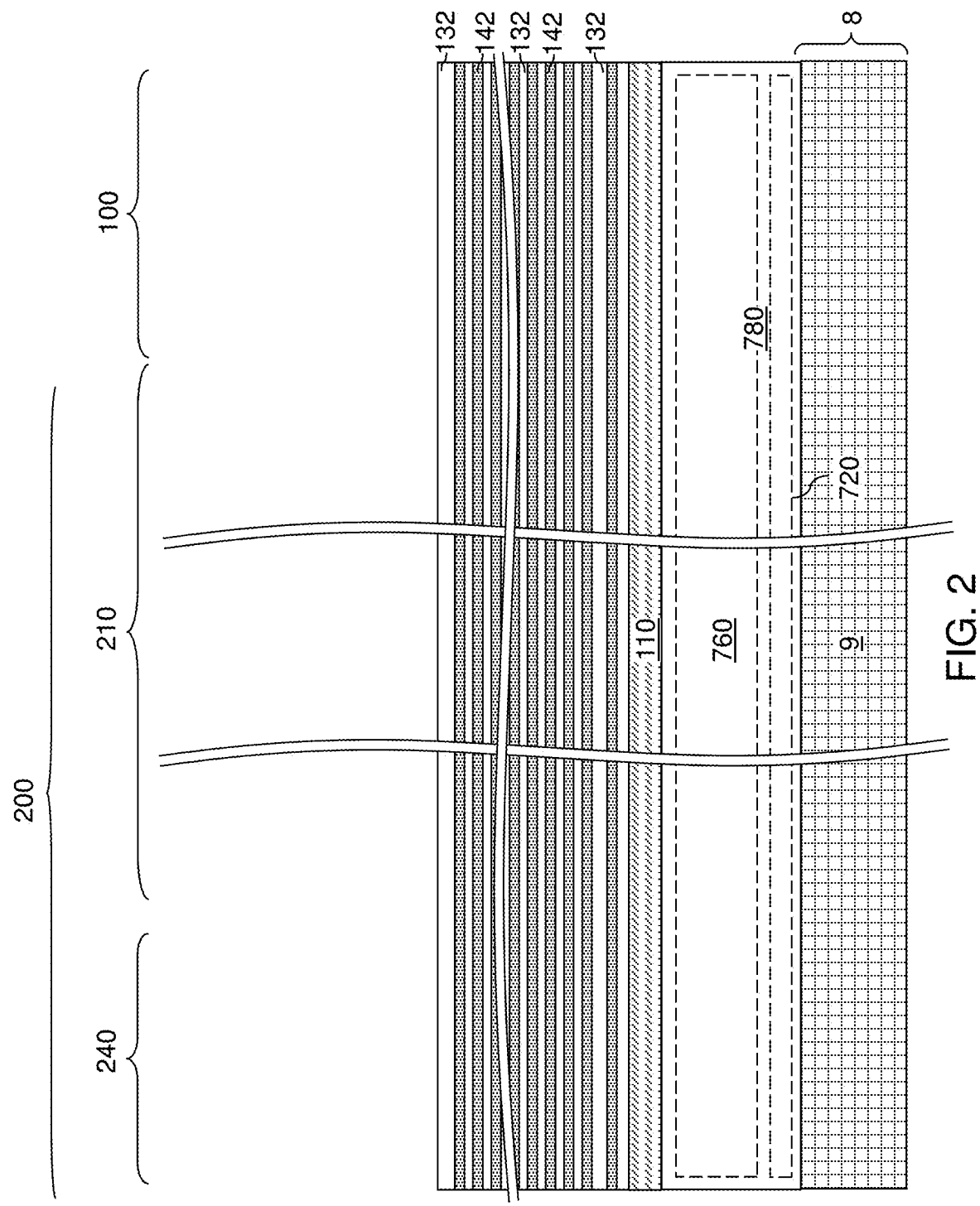
FIG. 2 is a vertical cross-sectional view of an exemplary structure after formation of semiconductor devices, lower level dielectric layers, lower metal interconnect structures, a semiconductor material layer, and a first vertically alternating sequence of first insulating layers and first spacer material layers according to an embodiment of the present disclosure.

The exemplary structure of FIGS. 1A-1F can be manufactured employing a sequence of processing steps. Referring to FIG. 2, an exemplary structure for formation of the structure of FIGS. 1A-1F is illustrated as a vertical cross sectional view along the first horizontal direction (e.g., word line direction) hd1. The structure shown in FIG. 2 is provided after formation of semiconductor devices 720 on a substrate semiconductor layer 9 provided at least within an upper portion of a substrate 8, lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first insulating layers 132 and first spacer material layers, which can include first sacrificial material layers 142. The substrate semiconductor layer 9 may comprise a top portion (e.g., a doped well) of a semiconductor substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

A first vertically alternating sequence of first insulating layers 132 and first spacer layers can be formed. Generally, spacer material layers within each alternating stack are formed as, or are subsequently replaced with, electrically conductive layers. As such, the first spacer material layers can be formed as, or can be subsequently replaced with, first electrically conductive layers 146.

The first insulating layers 132 can be composed of the first material, and the first sacrificial material layers 142 can be composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 is a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

Referring to FIG. 3, a first configuration of the exemplary structure according to a first embodiment is illustrated after formation of a set of stepped surfaces in each terrace region 210. Multiple sets of stepped surfaces can be formed in multiple terrace regions 210 simultaneously. The multiple sets of stepped surfaces can be formed in terrace regions 210 of the first vertically alternating sequence (132, 142) by iteratively performing a set of layer patterning processing steps at least twice. The set of layer patterning processing steps comprises a patterned photoresist material layer formation step in which a respective patterned photoresist material layer with a respective array of openings therein is formed over the first vertically alternating sequence (132, 142), and a pattern transfer step in which a pattern in the respective patterned photoresist material layer is transferred through a respective number of layers within the first vertically alternating sequence (132, 142). Each patterned photoresist material layer can be removed after the pattern transfer step, for example, by ashing.

In one embodiment, each set of stepped surfaces of the multiple sets of stepped surfaces can comprise a staircase region surface 23S formed in a staircase region 21S and cliff region surfaces 23C formed in a cliff region 21C. A cliff region 21C as used herein is a region in which the average taper angle (as determined by measuring a total lateral extent of a tapered and/or stepped surfaces and a total vertical extent of the tapered and/or stepped surfaces) is less than 45 degrees. The cliff region 21C can be adjoined to a periphery of the staircase region 21S.

In one embodiment, an average lateral spacing between neighboring pairs of vertical steps in the cliff region 21C may be less than the sum of the average thickness of the first insulating layers 132 and the average thickness of the first spacer material layers (such as the first sacrificial material layers 142). In contrast, in one embodiment, the average lateral spacing between neighboring pairs of vertical steps in the staircase region 21S may be greater than the sum of an average thickness of the first insulating layers 132 and the average thickness of the first spacer material layers (such as the first sacrificial material layers 142). In one embodiment, the lateral extent of the staircase region 21S along the first horizontal direction hd1 can be at least five times the lateral extent of the cliff region 21C along the first horizontal direction hd1, and may be at least ten times, such as 10 to 50 times, the lateral extent of the cliff region 21C along the first horizontal direction hd1.

In the first configuration of the first embodiment, the heights of the horizontal surfaces of the stepped surfaces along the first horizontal direction hd1 can monotonically or strictly increase with a lateral distance from one of the memory array regions 100 to another of the memory array regions 100 along the first horizontal direction hd1. In other words, the stepped surfaces in the staircase region 21S may be monotonically ascending or monotonically descending for each staircase region 21S.

FIGS. 4A-4E are top-down views of patterned photoresist material layers (410, 420, 430, 440, 450) that can be sequentially employed to form stepped surfaces in the terrace regions 210 according to the second configuration of the exemplary structure of a second embodiment of the present disclosure. Locations of dielectric wall structures 76 to be subsequently formed within a respective line trench are juxtaposed to the top-down views of the patterned photoresist material layers (410, 420, 430, 440, 450). In the illustrated example, a first patterned photoresist layer 410 is illustrated in FIG. 4A, a second patterned photoresist layer 420 is illustrated in FIG. 4B, a third patterned photoresist layer 430 is illustrated in FIG. 4C, a fourth patterned photoresist layer 440 is illustrated in FIG. 4D, and a fifth patterned photoresist layer 450 is illustrated in FIG. 4E.

FIGS. 5A-5E are vertical cross-sectional views of the exemplary structure during formation of stepped surfaces in the terrace regions 200 using the respective patterned photoresist material layers (410, 420, 430, 440, 450) of FIGS. 4A-4E according to an embodiment of the present disclosure. The patterned photoresist material layers (410, 420, 430, 440, 450) of FIGS. 4A-4E are illustrated schematically in respective FIGS. 5A-5E.

Figure 5A:
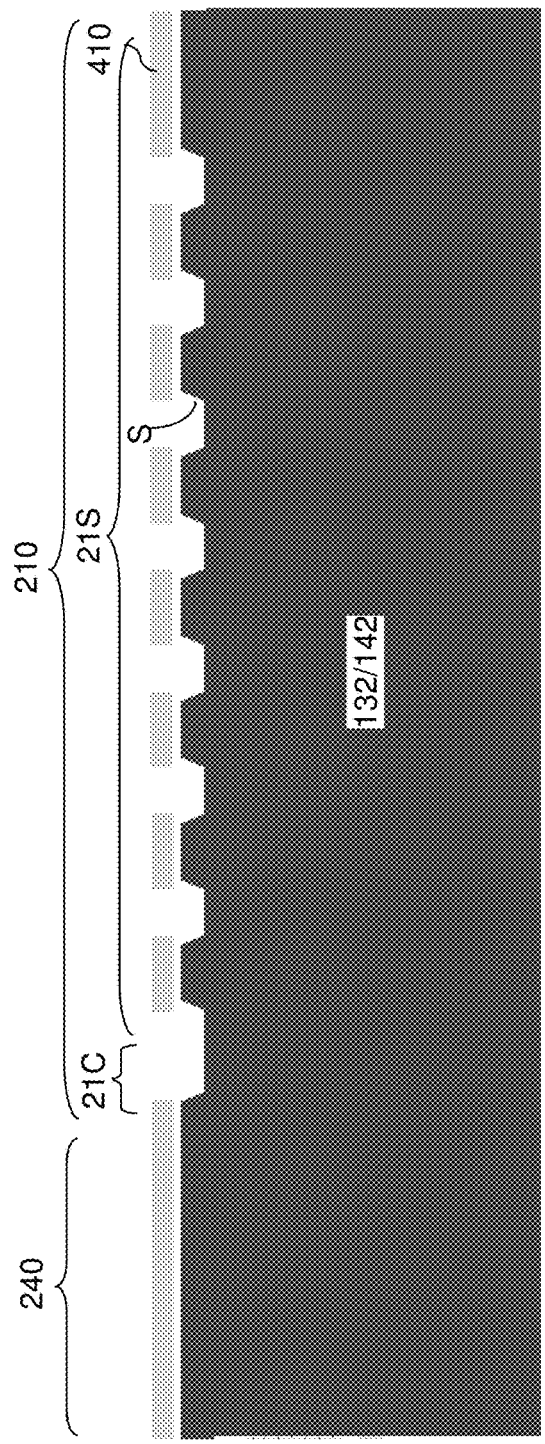
FIGS. 5A-5E are vertical cross-sectional views of the second configuration of the exemplary structure during formation of stepped surfaces in the terrace regions according to an embodiment of the present disclosure. Patterned photoresist material layers are schematically illustrated.
Figure 5B:
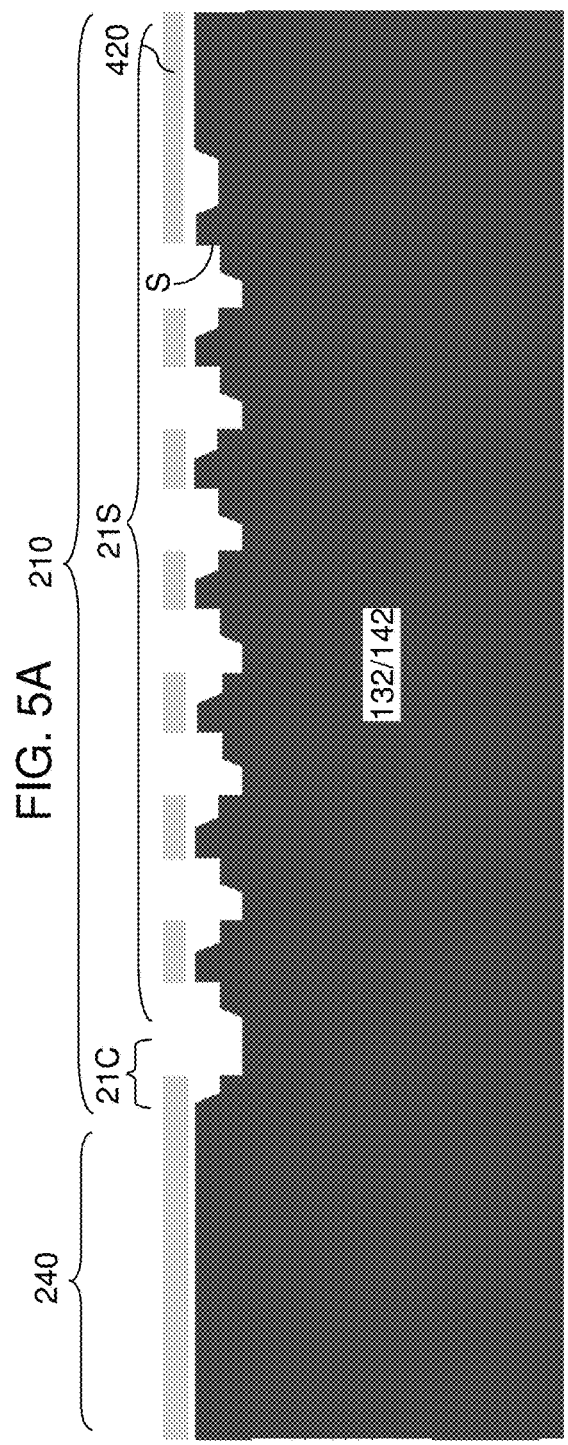
Figure 5C:
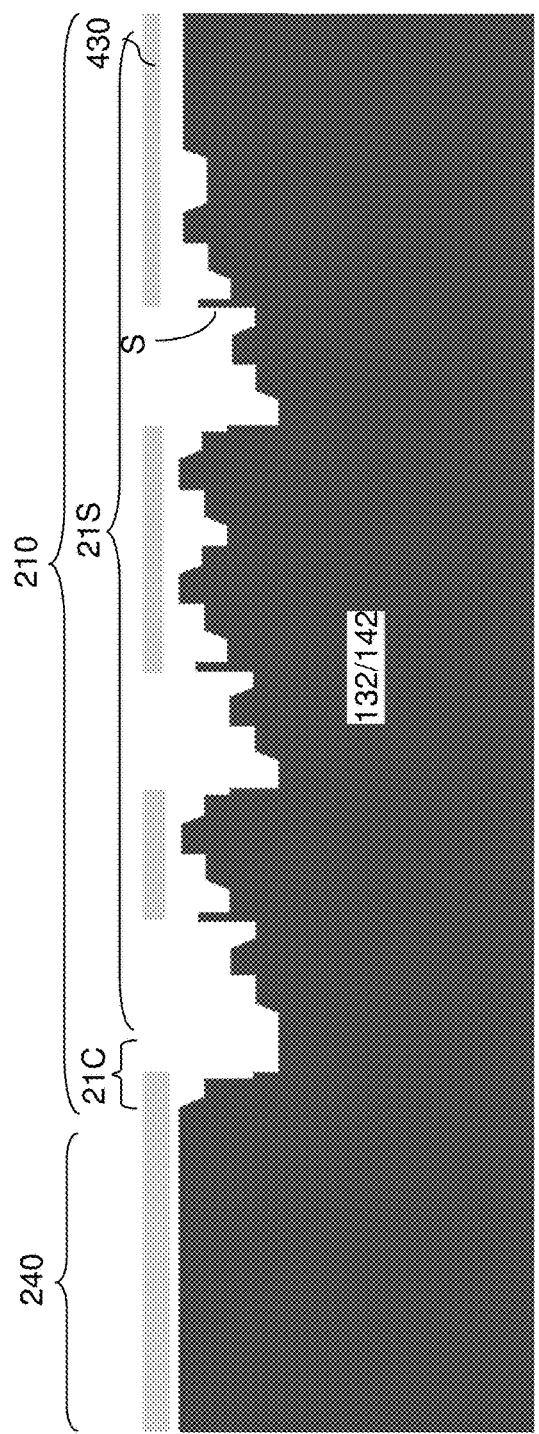
Figure 5D:
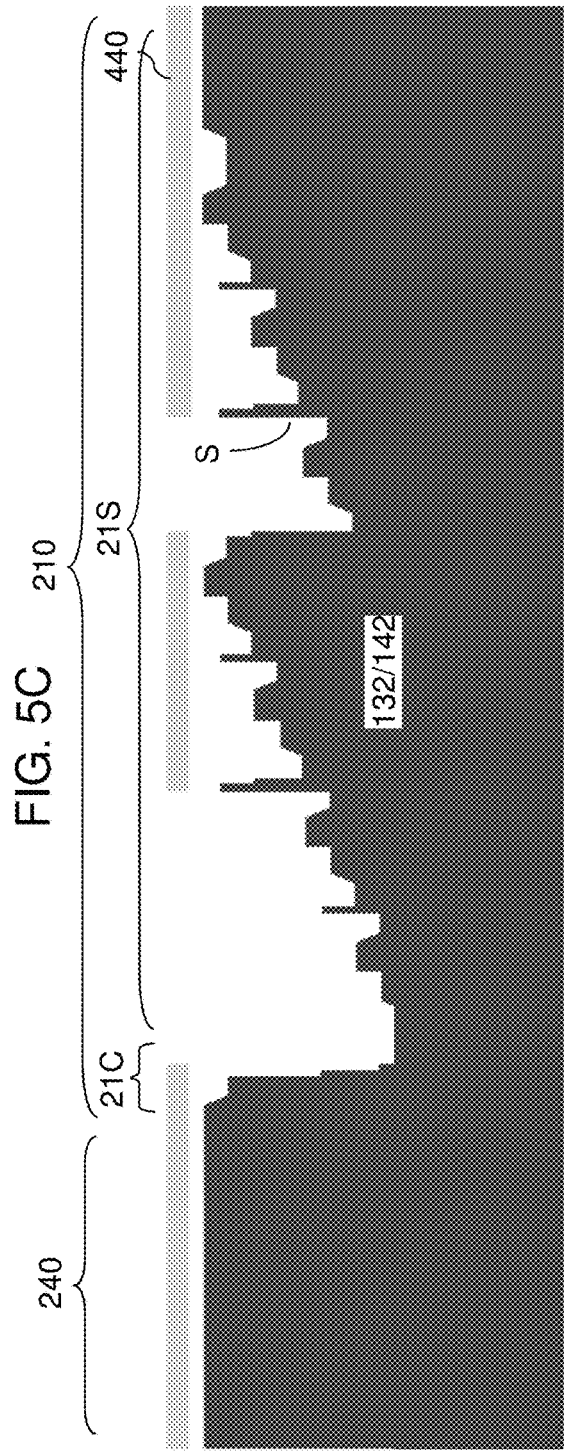
Figure 5E:
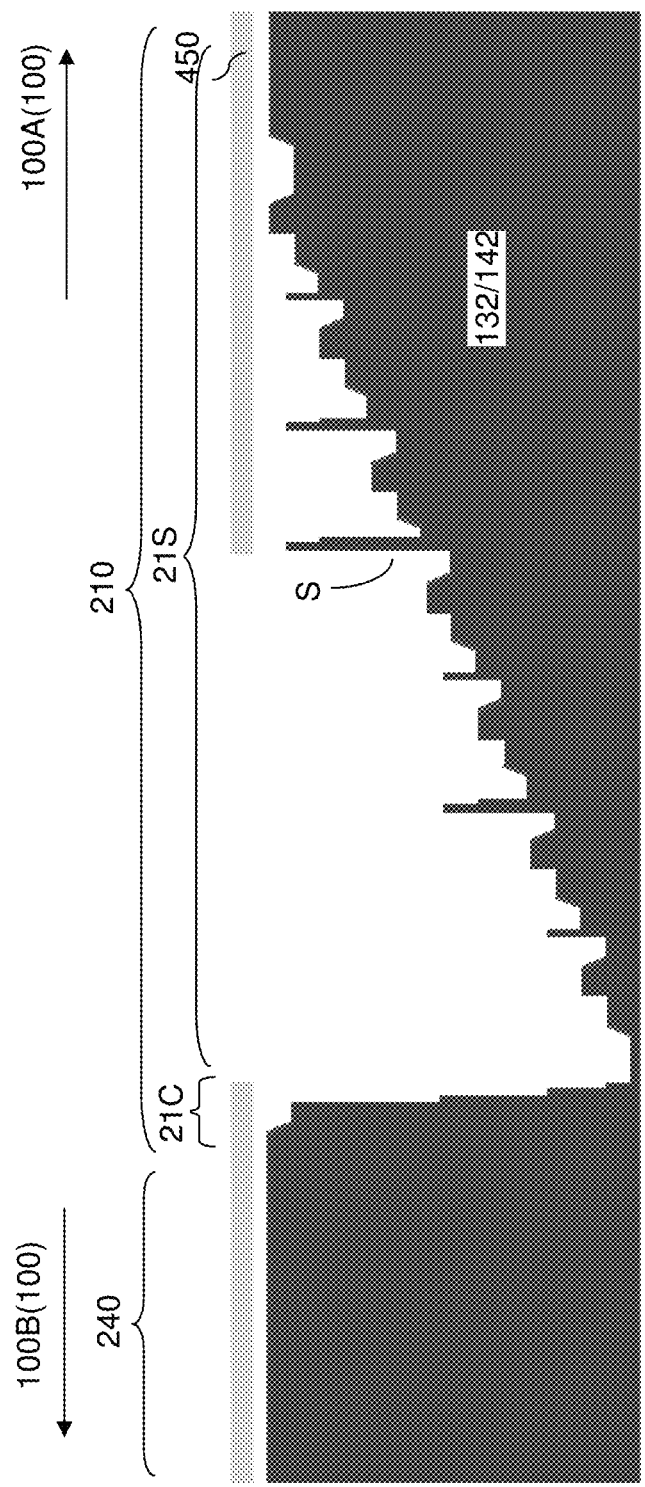

FIG. 5A illustrates a terrace region 210 after a first pattern transfer step in which the pattern in the first patterned photoresist material layer 410 is transferred through the first vertically alternating sequence (132, 142) by a first set of first insulating layers 132 and first sacrificial material layers 142 (e.g., such as five layers). FIG. 5B illustrates the terrace region 210 after a second pattern transfer step in which the pattern in the second patterned photoresist material layer 420 is transferred through the first vertically alternating sequence (132, 142) by at second set of first insulating layers 132 and first sacrificial material layers 142 (e.g., seven layers). FIG. 5C illustrates the terrace region 210 after a third pattern transfer step in which the pattern in the third patterned photoresist material layer 430 is transferred through the first vertically alternating sequence (132, 142) by a third set of first insulating layers 132 and first sacrificial material layers 142 (e.g., 14 layers). FIG. 5D illustrates the terrace region 210 after a fourth pattern transfer step in which the pattern in the fourth patterned photoresist material layer 440 is transferred through the first vertically alternating sequence (132, 142) by a fourth set of first insulating layers 132 and first sacrificial material layers 142 (e.g., 28 layers). FIG. 5E illustrates the terrace region 210 after a fifth pattern transfer step in which the pattern in the fifth patterned photoresist material layer 450 is transferred through the first vertically alternating sequence (132, 142) by a fifth set of first insulating layers 132 and first sacrificial material layers 142 (e.g., 37 layers). The patterning may be conducted without using a hard mask layer (e.g., insulating mask) overlying the alternating sequence (142, 242), which simplifies the process.

Generally, N patterned photoresist layers (410, 420, 430, 440, 450) can be employed, in which N is an integer greater than 1. Each of the N patterned photoresist layers (410, 420, 430, 440, 450) can be employed in a respective one of the layer patterning processing step as a respective patterned photoresist layer. Each of the N patterned photoresist layers (410, 420, 430, 440, 450) can provide different opening patterns therein such that up to $2^N$ types of areas are generated depending on whether each of the N patterned photoresist layers (410, 420, 430, 440, 450) covers the respective area or not. All, or only some, of the $2^N$ types of areas may be employed to pattern the staircase regions 21S and to provide a corresponding number of steps.

In the second configuration of the second embodiment, edges of the openings within the N patterned photoresist layers (410, 420, 430, 440, 450) may be positioned such that at least one vertical step S has a height that is greater than the sum of a thickness of a first insulating layer 132 and a thickness of a first sacrificial material layer 142. In this case, sidewalls of a multiple first insulating layers 132 and multiple first sacrificial material layers 142 can be physically exposed at a subset of the vertical steps S within the staircase region 21S located within the terrace region 210.

Figure 6A:
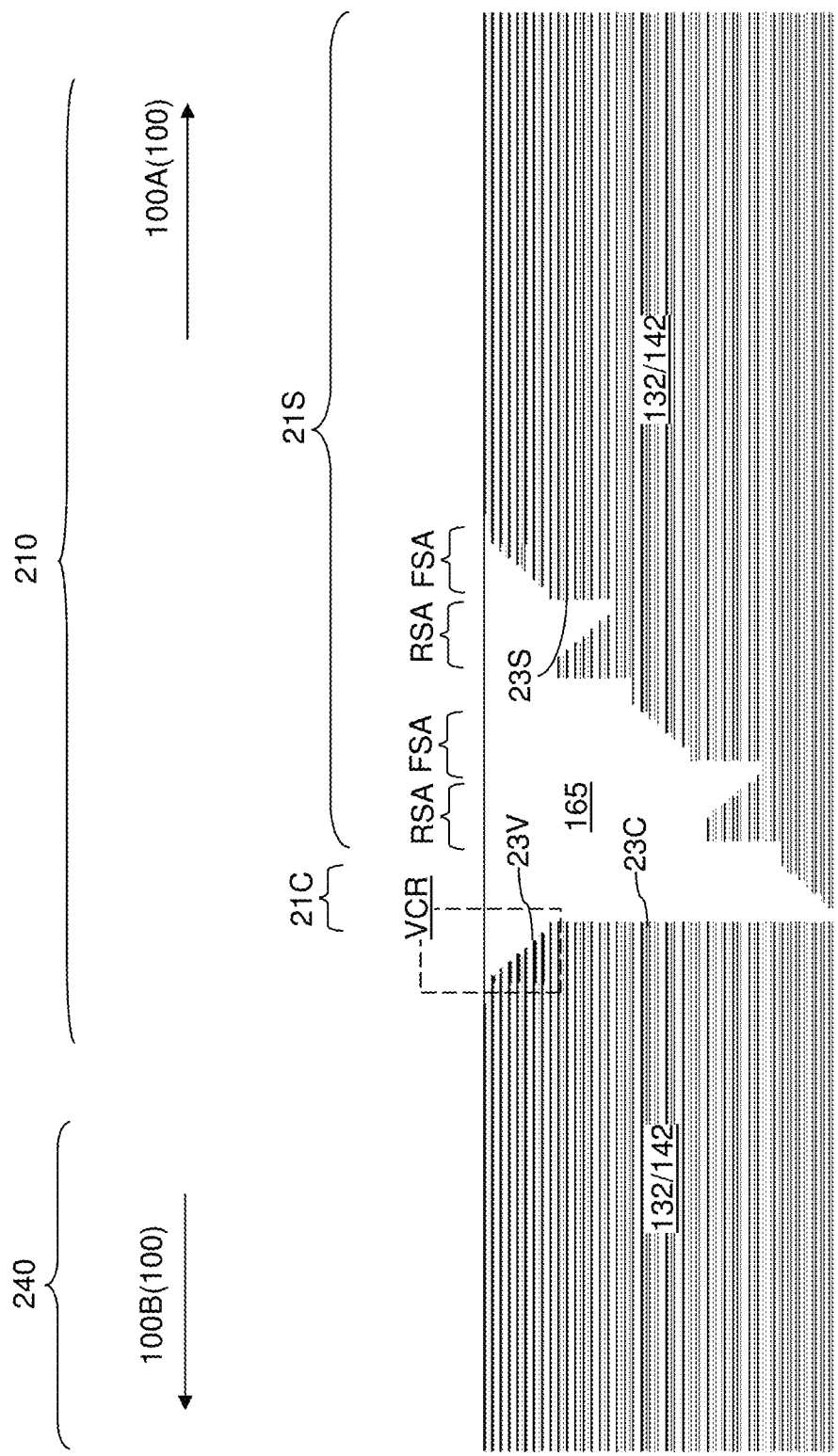
FIG. 6A is a vertical cross-sectional view of a terrace region of the second configuration of the exemplary structure after formation of stepped surfaces and first dielectric material portions overlying the stepped surfaces.

FIG. 6A illustrates is a generalized illustration of the lower alternating stack (132, 142) of insulating and sacrificial material layers in the staircase region 210 made according to the second embodiment. The staircase region 210 can include at least one forward staircase area FSA and at least one reverse staircase area RSA. As used herein, a forward staircase refers to a contiguous subset of stepped surfaces in which the height of a horizontal surface always increases with each vertical step along a horizontal direction (such as the first horizontal direction hd1, e.g., left to right in FIG. 6A) that laterally extends from a bottommost horizontal surface among all contiguous stepped surfaces toward a topmost horizontal surface among all contiguous stepped surfaces. An area in which a forward staircase is located is herein referred to as the forward staircase area FSA. As used herein, a reverse staircase refers to a contiguous subset of stepped surfaces in which the height of a horizontal surface always decreases with each vertical step along a horizontal direction (such as the first horizontal direction hd1, e.g., left to right in FIG. 6A) that laterally extends from a bottommost horizontal surface among all contiguous stepped surfaces toward a topmost horizontal surface among all contiguous stepped surfaces. An area in which a reverse staircase is located is herein referred to as a reverse staircase area RSA. As such, all stepped surfaces include at least one forward staircase, and may, or may not, include a reverse staircase. The RSA provides an area savings when used in combination with the array interconnection region (e.g., "bridge" region) 220, which improves device density.

In one embodiment, the pair of memory array regions 100 adjoined to each inter-array region 200 can include a first memory array region 100A and a second memory array region 100B. The bottommost horizontal surface of a staircase region 21S may be provided on the side of the second memory array region 100B, and the topmost horizontal surface of the staircase region 21S may be provided on the side of the first memory array region 100A. A vertical step of an overlying spacer material layer (such as an overlying first sacrificial material layer 142) is more proximal to the first memory array region 100A than a vertical step of an underlying spacer material layer is to the first memory array region 100A for a vertically neighboring pair of spacer material layers within each forward staircase. A vertical step of an overlying spacer material layer (such as an overlying first sacrificial material layer 142) is less proximal to the first memory array region 100A than a vertical step of an underlying spacer material layer is to the first memory array region 100A for a vertically neighboring pair of spacer material layers in each reverse staircase.

Each vertical interconnection via region 240 may be unpatterned, and thus, may include all of the layers within the first vertically alternating sequence for the first configuration and for the second configuration. A first-tier structure including a first vertically alternating sequence (132, 142) and first retro-stepped dielectric material portions 165 is formed. The stepped surfaces in the first-tier structure are herein referred to as first stepped surfaces.

Figure 6B:
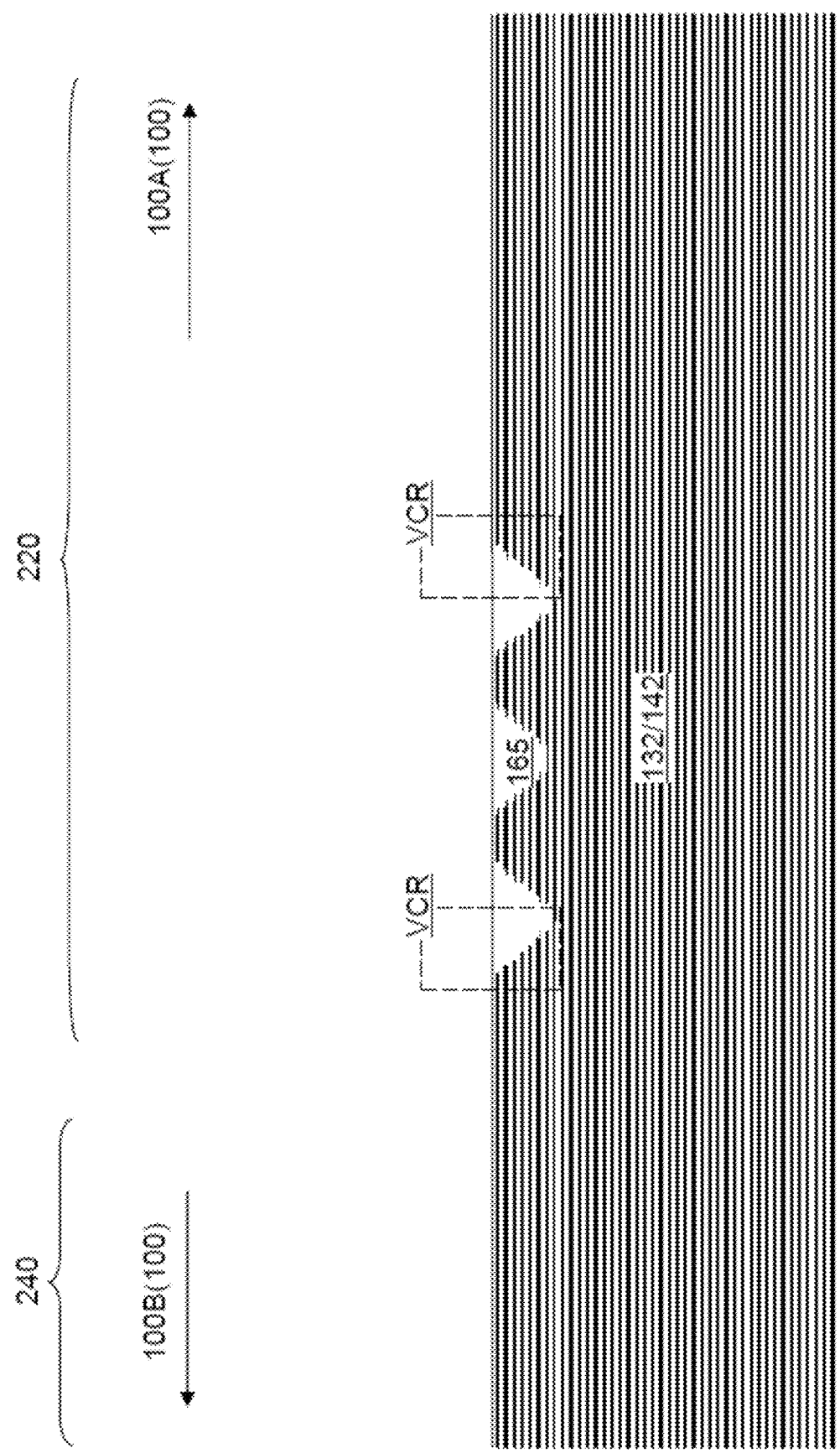
FIG. 6B is a vertical cross-sectional view of the array interconnection region of the second configuration of the exemplary structure of FIG. 6A after formation of stepped surfaces and first dielectric material portions overlying the stepped surfaces.
Figure 6C:
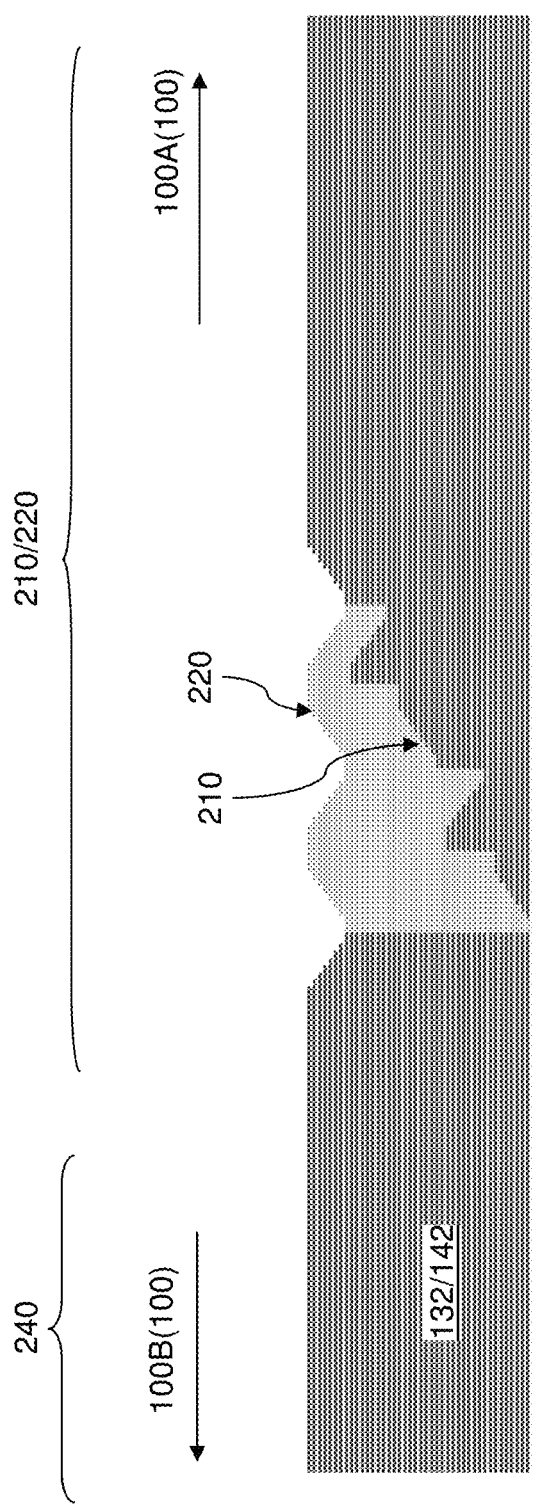
FIG. 6C is vertical partial see-through view of the second configuration of the exemplary structure of combining the views of FIG. 6A and FIG. 6B.
Figure 6D:
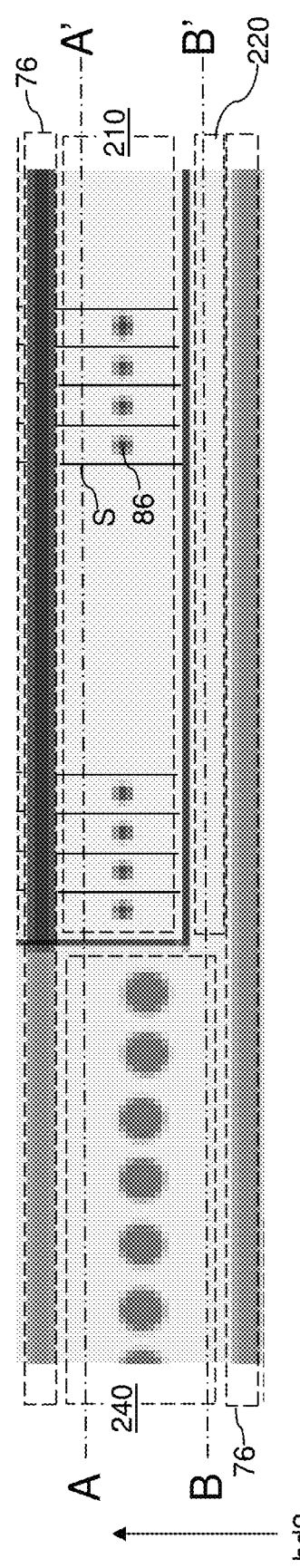
FIG. 6D is a top view of the second configuration of the exemplary structure of FIGS. 6A-6C. The vertical plane A-A' corresponds to the view in FIG. 6A. The vertical plane B-B' corresponds to the view in FIG. 6B.

Referring to FIGS. 6A and 6B, a second configuration of the exemplary structure is illustrated after formation of stepped surfaces and first dielectric material portions (which are herein referred to as a first retro-stepped dielectric material portion 165) overlying the stepped surfaces of the first vertically alternating stack (132, 142). FIG. 6C is a vertical partial see-through view of the second configuration of the exemplary structure of combining the views of FIG. 6A and FIG. 6B with the first retro-stepped dielectric material portion 165 removed for clarity. FIG. 6D is a top view of the second configuration of the exemplary structure of FIGS. 6A-6C. The vertical plane A-A' corresponds to the view in FIG. 6A. The vertical plane B-B' corresponds to the view in FIG. 6B.

As illustrated in FIGS. 6B and 6C, an upper subset of layers within the first vertically alternating sequence (132, 142) is trimmed away (i.e., is patterned) within the array interconnection region 220 during the steps shown in FIGS. 5A-5E, since a hard mask is not used during the patterning steps. Therefore, the upper subset of the upper electrically conductive layers (e.g., 146) that will be formed in the structure will not be electrically connected through the array interconnection region 220. Therefore, a tapered portion of the terrace region 210 that is located between a cliff region 21C and a vertical interconnection via region 240 can have stepped surfaces for subsequently forming contact via structures thereupon, and is herein referred to as a via contact region VCR. The via contact region VCR may laterally extend into an adjacent portion of the array interconnection region 220, and can be subsequently employed to form via contact structures therein which interconnect the upper subset of upper electrically conductive layers 146 extending between the memory array regions 100A and 100B. Generally, a via contact region VCR can be formed in each region in which physical continuity of the first sacrificial material layers 142 is broken along the first horizontal direction hd1 (i.e., in which the upper sacrificial material layers 142 do not extend through the array interconnection region 220). The stepped surfaces 23V of the via contact region VCR has a greater taper (i.e., slope) than the cliff region surface 23C, as shown in FIG. 6A. The dielectric material portions (such as the first retro-stepped dielectric material portions 165) can be formed on each of the multiple sets of stepped surfaces of the vertically alternating sequence (132, 242) in each of the terrace regions 210.

Figure 7A:
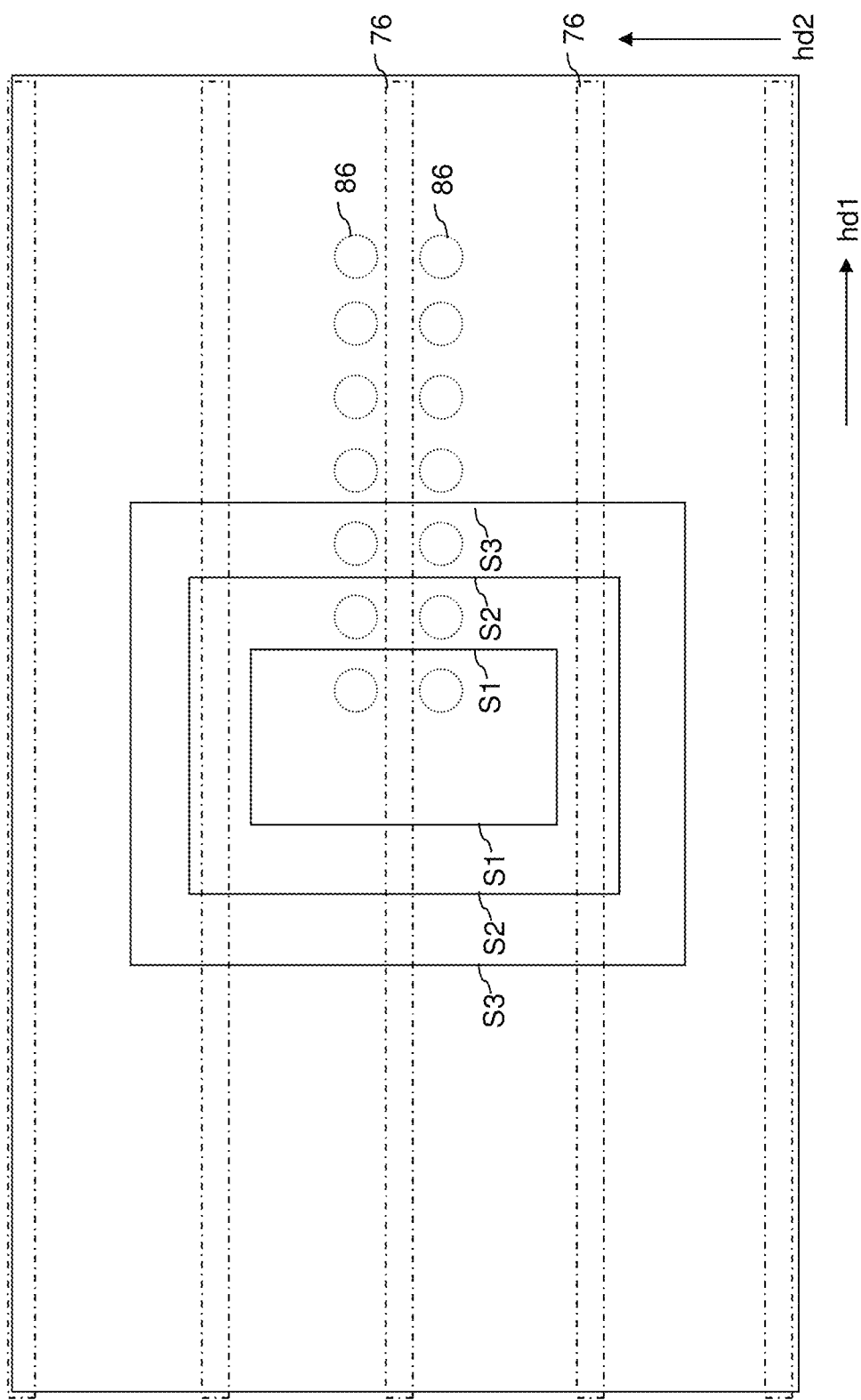
FIG. 7A is a plan view of patterns of a first trimmable mask material layer for forming a first subset of stepped surfaces for the second configuration of the exemplary structure according to an embodiment of the present disclosure.
Figure 7B:
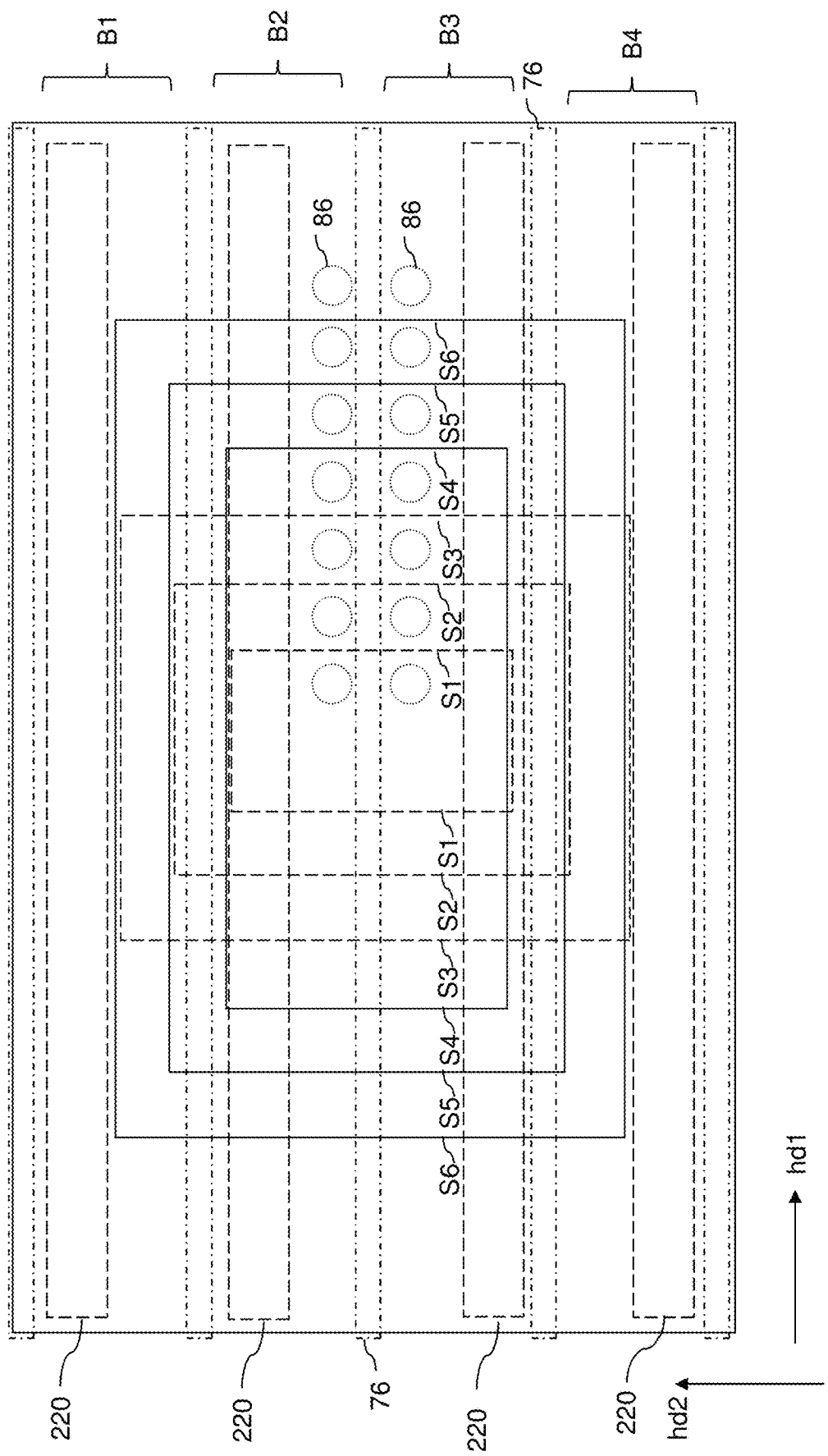
FIG. 7B is a plan view of patterns of a second trimmable mask material layer for forming a second subset of stepped surfaces for the second configuration of the exemplary structure according to an embodiment of the present disclosure.

In some embodiment, the stepped surfaces (e.g., the surfaces 23V) within the via contact regions VCR and optionally an upper subset of the surfaces within the stepped surfaces of the staircase regions 21S can be formed employing at least one trimmable mask material layer. FIGS. 7A and 7B illustrate patterns for trimmable mask material layers (e.g., photoresist layers) that can be employed to form the stepped surfaces within the via contact regions VCR and optionally the upper subset of the surfaces within the stepped surfaces of the staircase regions 21S.

FIG. 7A is a plan view of patterns of a first trimmable mask material layer for forming a first subset of stepped surfaces for the second configuration of the exemplary structure. Locations of dielectric wall structures 76 to be subsequently formed are illustrated in dotted lines. Further, locations of layer contact via structures 86 to be subsequently formed are illustrated in dotted lines. The first trimmable mask material layer can be formed as an unpatterned photoresist material layer, and can be lithographically patterned to form a first rectangular opening S1 including edges that are parallel to the second horizontal direction hd2. A first anisotropic etch process can be performed to etch at least a topmost first insulating layer 132 and a topmost first sacrificial material layer 142 within the area of the first rectangular opening S1. Vertical steps are formed along the periphery of the first rectangular opening S1. Subsequently, an isotropic photoresist trimming process can be performed to isotropically etch the first trimmable mask material layer. The first rectangular opening S1 is laterally expanded to provide a second rectangular opening S2 having a pair of edges that are parallel to the second horizontal direction hd2. A second anisotropic etch process can be performed to etch at least one pair of a first insulating layer 132 and a first sacrificial material layer 142 within the area of the second rectangular opening S2. Additional vertical steps can be formed along the periphery of the second rectangular opening S2. Another isotropic trimming process can be performed to isotropically etch the first trimmable mask material layer. The second rectangular opening S2 is laterally expanded to provide a third rectangular opening S3 having a pair of edges that are parallel to the second horizontal direction hd2. A third anisotropic etch process can be performed to etch at least one pair of a first insulating layer 132 and a first sacrificial material layer 142 within the area of the third rectangular opening S3. Additional vertical steps can be formed along the periphery of the third rectangular opening S3. Subsequently, the first trimmable mask material layer can be removed, for example, by ashing.

FIG. 7B is a plan view of patterns of a second trimmable mask material layer for forming a second subset of stepped surfaces for the second configuration of the exemplary structure. The second trimmable mask material layer can be formed as an unpatterned photoresist material layer, and can be lithographically patterned to form a fourth rectangular opening S4 including edges that are parallel to the second horizontal direction hd2. The edges of the fourth rectangular openings S4 that extend along the second horizontal direction hd2 can be laterally offset from the vertical steps that extend along the second horizontal direction hd2 and are formed at the processing steps of FIG. 7A. A fourth anisotropic etch process can be performed to etch at least one pair of a first insulating layer 132 and a first sacrificial material layer 142 within the area of the fourth rectangular opening S4. Vertical steps formed along the periphery of the fourth rectangular opening S4. Subsequently, an isotropic trimming process can be performed to isotropically etch the second trimmable mask material layer. The fourth rectangular opening S4 is laterally expanded to provide a fifth rectangular opening S5 having a pair of edges that are parallel to the second horizontal direction hd2. A fifth anisotropic etch process can be performed to etch at least one pair of a first insulating layer 132 and a first sacrificial material layer 142 within the area of the fifth rectangular opening S5. Additional vertical steps can be formed along the periphery of the fifth rectangular opening S5. Another isotropic trimming process can be performed to isotropically etch the second trimmable mask material layer. The fifth rectangular opening S5 is laterally expanded to provide a sixth rectangular opening S6 having a pair of edges that are parallel to the second horizontal direction hd2. A sixth anisotropic etch process can be performed to etch at least one pair of a first insulating layer 132 and a first sacrificial material layer 142 within the area of the sixth rectangular opening S6. Additional vertical steps can be formed along the periphery of the sixth rectangular opening S6. Subsequently, the second trimmable mask material layer can be removed, for example, by ashing.

While the present disclosure is described employing an embodiment in which six vertical steps are formed employing two trimmable mask material layers, the number of trimmable mask material layer and the number of trimming steps employed to expand openings in a respective trimmable mask material layer may be modified as needed. Generally, at least two vertical steps can be formed employing at least one trimmable mask material layer. The additional vertical steps can be formed in the via contact regions VCR and optionally within the stepped surfaces of the staircase regions 21S.

As shown in FIG. 7B, the openings S1-S6 may cut all the way through the upper set layers in the array interconnection regions 220 in some memory blocks (e.g., blocks B2 and B3) located between neighboring dielectric wall structures 76. Therefore, the upper electrically conductive layers 146 in these memory blocks (B2, B3) will be connected separately by connecting their respective via contact regions VCR, as will be described in more detail below. However, the openings S1-S6 may not cut through the upper set layers in the array interconnection regions 220 in some other memory blocks (e.g., blocks B1 and B4) located between other neighboring dielectric wall structures 76. Therefore, in these memory blocks (B1, B4), the upper electrically conductive layers 146 are connected through the array interconnection regions (e.g., "bridge" regions) 220. Thus, the stepped via contact regions VCR are not formed in these memory blocks (B1, B4).

Generally, a trimmable mask material layer having a first pattern can be applied over the first vertically alternating sequence (132, 142) as part of, prior to, after, or between instances of performance of the set of layer patterning processing steps employed at the processing steps corresponding to FIGS. 4A-4E and FIGS. 5A-5E. The first pattern in the trimmable mask material layer can be transferred into underlying layers of the first vertically alternating sequence (132, 142) employing a first etch process. The trimmable mask material layer can be isotropically trimmed after the first etch process to provide a second pattern in the trimmable mask material layer. The second pattern in the trimmable mask material layer can be transferred into the first vertically alternating sequence (132, 142) employing a second etch process. The trimming step and the pattern transfer step may be repeated as many times as needed. Further, additional trimmable mask material layer(s) may be optionally employed to pattern additional vertical steps.

Figure 8:
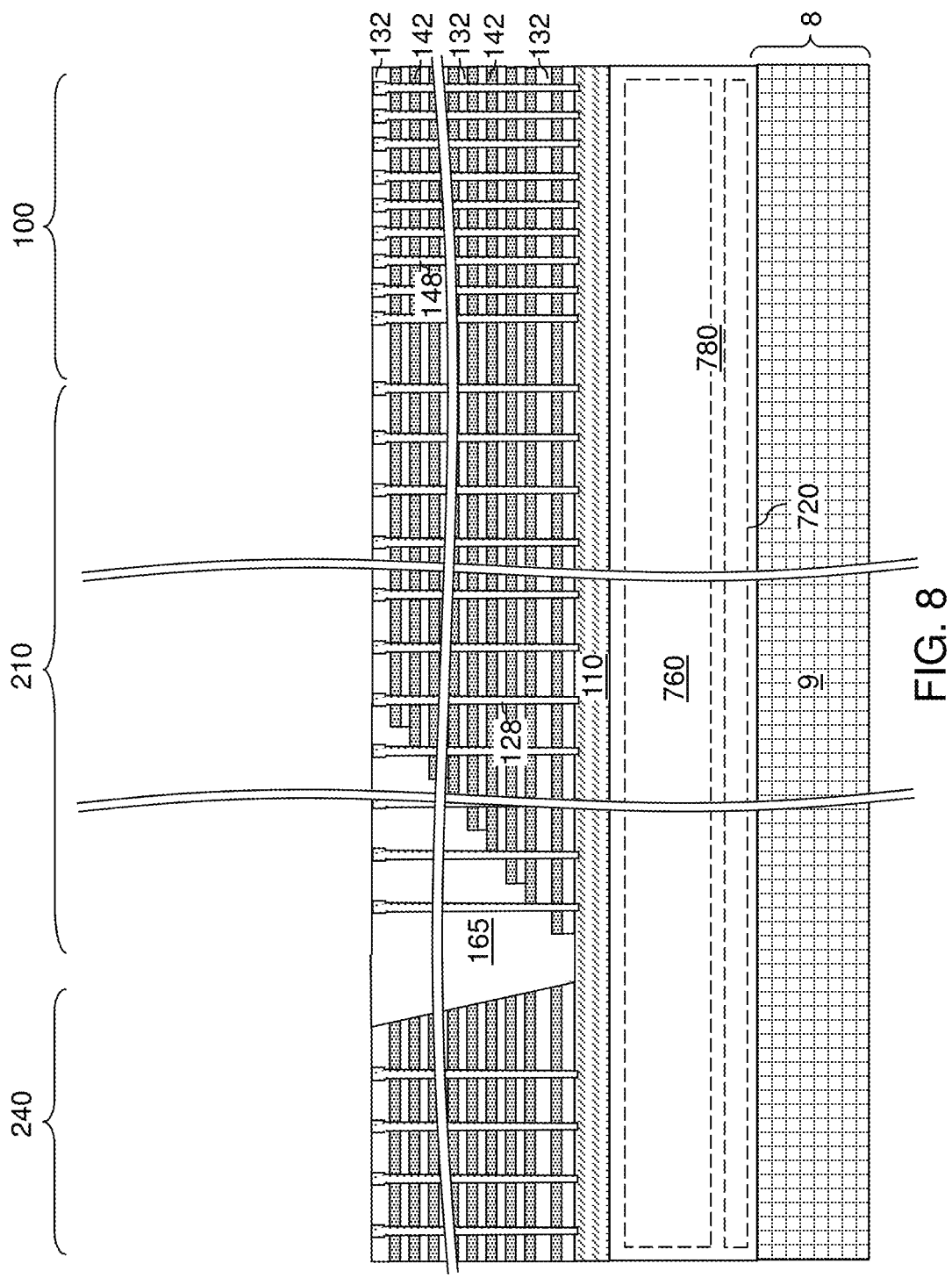
FIG. 8 is a vertical cross-sectional view of the exemplary structure after formation of first-tier opening fill structures according to an embodiment of the present disclosure.

Referring to FIG. 8, various first-tier openings may be formed through the first vertically alternating sequence (132, 142) and into the semiconductor material layer 110. A photoresist layer (not shown) may be applied over the first vertically alternating sequence (132, 142), and may be lithographically patterned to form various openings therethrough. The pattern of openings in the photoresist layer may be transferred through the first vertically alternating sequence (132, 142) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array regions 200. Each cluster of first-tier memory openings may be formed as a two-dimensional array of first-tier memory openings. The first-tier support openings are openings that are formed in the inter-array regions 200, and are subsequently employed to form support pillar structures. A subset of the first-tier support openings may be formed through a respective horizontal surface of the stepped surfaces. It should be noted that while the first configuration of the first embodiment containing only the forward staircase areas (FSA) is shown in FIG. 8 for simplicity, the second configuration of the second embodiment which includes reverse staircase areas (RSA) in addition to FSA may be formed instead.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first vertically alternating sequence (132, 142), such as from above the topmost first insulating layer 132. For example, the sacrificial first-tier fill material may be recessed to a top surface of the topmost first insulating layer 132 using a planarization process. The planarization process may include a recess etch, chemical mechanical planarization (CMP), or a combination thereof. The top surface of the topmost first insulating layer 132 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the topmost first insulating layer 132). The top surfaces of the sacrificial first-tier opening fill portions (148, 128) may be coplanar with the top surface of the topmost first insulating layer 132. Each of the sacrificial first-tier opening fill portions (148, 128) may, or may not, include cavities therein.

Figure 9:
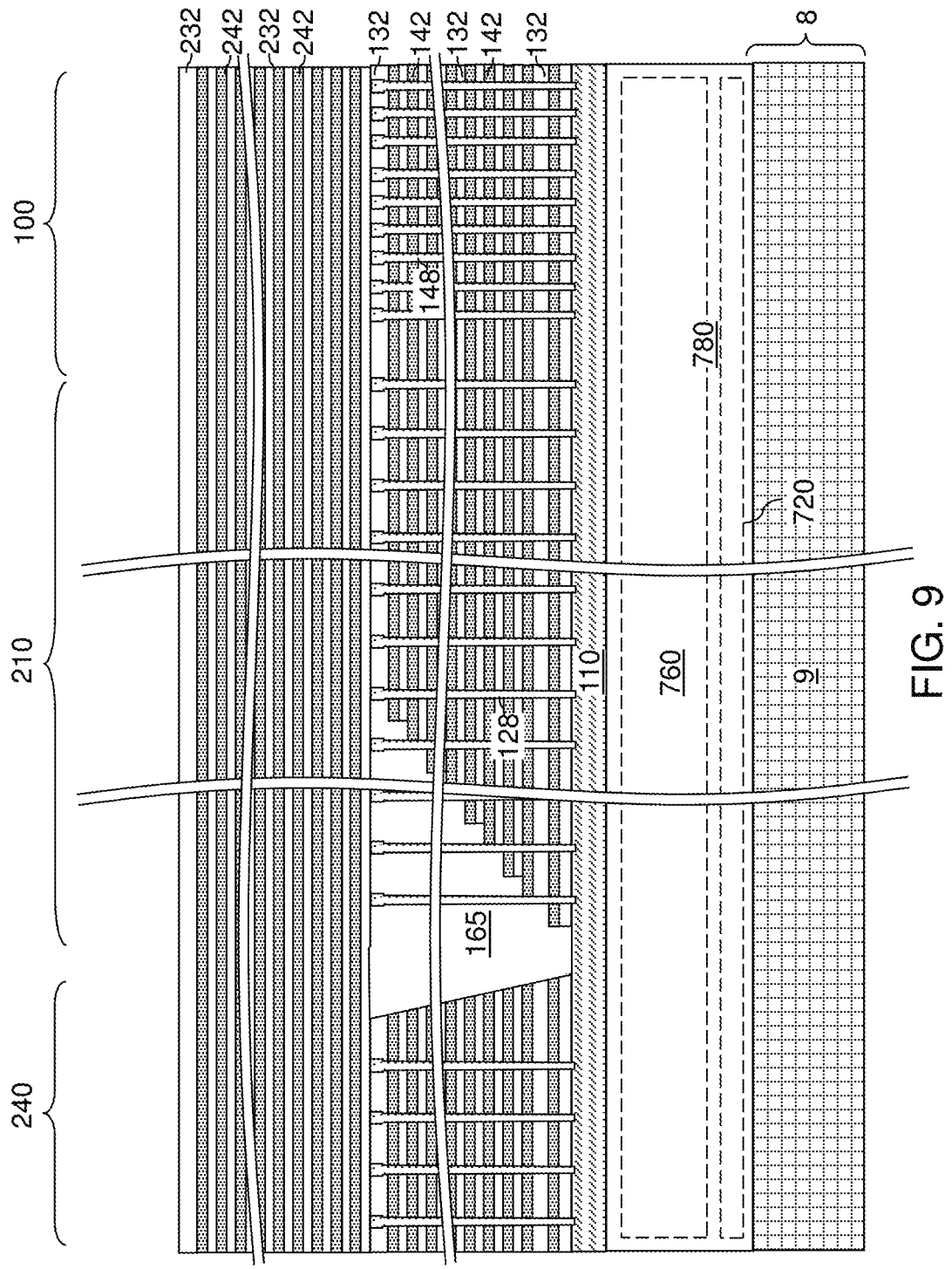
FIG. 9 is a vertical cross-sectional view of the exemplary structure after formation of a second vertically alternating sequence of second insulating layers and second spacer material layers according to an embodiment of the present disclosure.

Referring to FIG. 9, a second vertically alternating sequence of second insulating layers 232 and second spacer material layers can be formed. The second spacer material layers can be second sacrificial material layers 242 that are subsequently replaced with second electrically conductive layers. The second insulating layers 232 can have the same material composition and the same thickness as the first insulating layers 132. The second spacer material layers can have the same material composition and the same thickness as the second spacer material layers.

Generally, at least one additional vertically alternating sequence of additional insulating layers and additional spacer material layers can be optionally formed over the first vertically alternating sequence (132, 142) and the first retro-stepped dielectric material portions 165. The additional spacer material layers can be formed as, or are subsequently replaced with, additional electrically conductive layers.

Figure 10A:
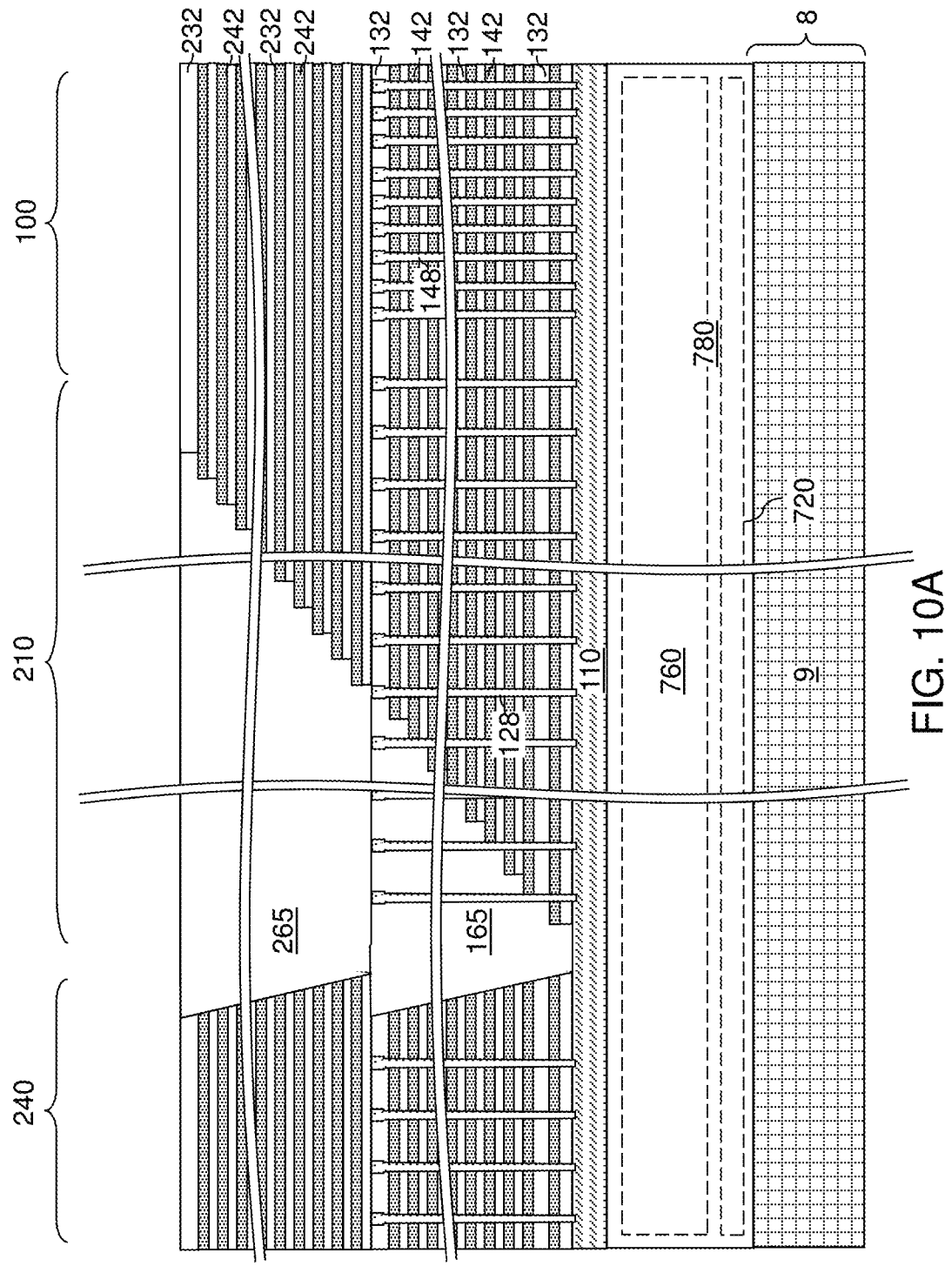
FIG. 10A is a vertical cross-sectional view of the first configuration of the exemplary structure along a vertical plane that includes a terrace region after formation of additional stepped surfaces on the second vertically alternating sequence and second dielectric material portions according to an embodiment of the present disclosure.
Figure 10B:
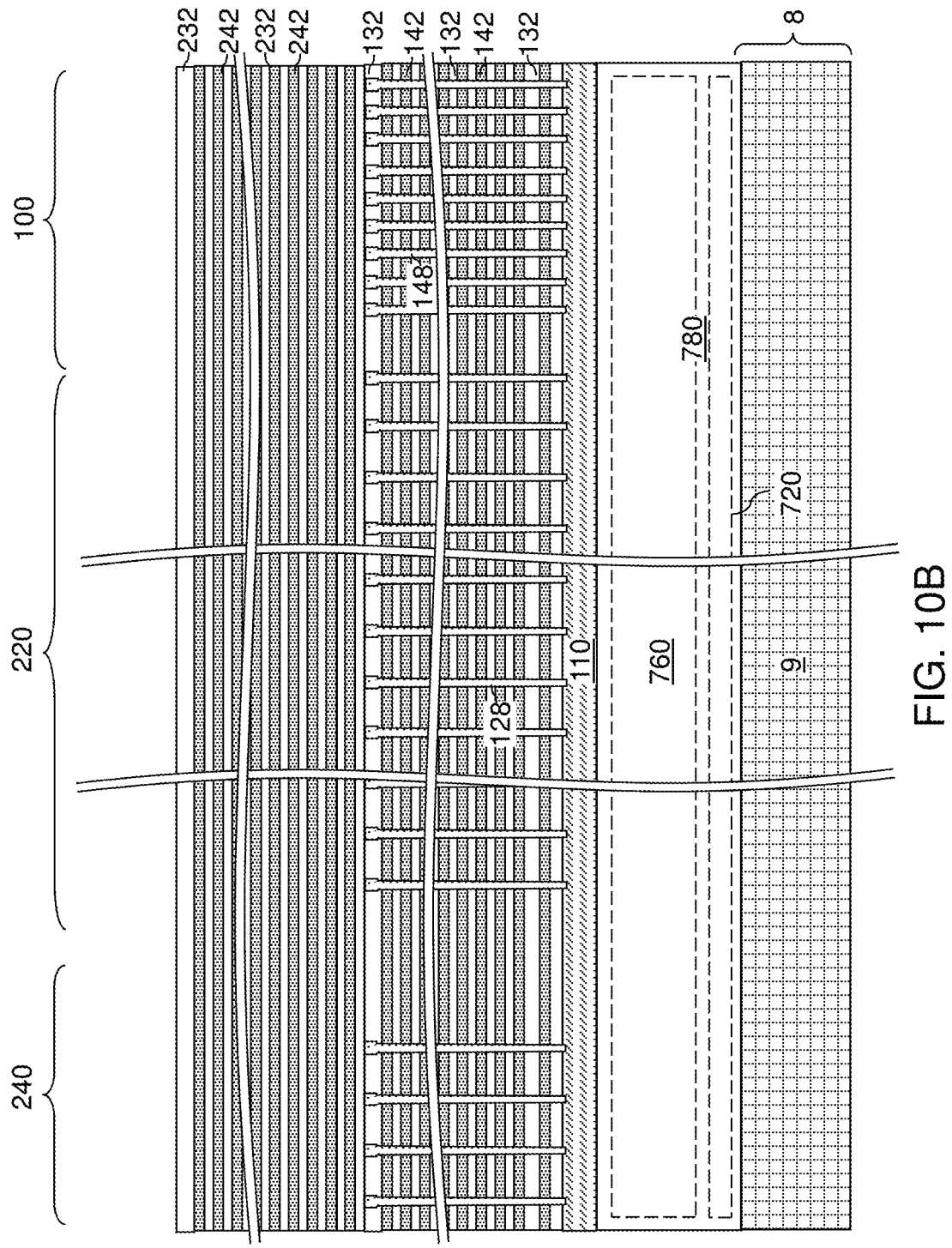
FIG. 10B is a vertical cross-sectional view of the first configuration of the exemplary structure along a vertical plane that includes an array connection region at the processing step of FIG. 10A.

Referring to FIGS. 10A and 10B, the first configuration of the exemplary structure is illustrated after the second vertically alternating sequence (232, 242) are patterned. The processing steps of FIG. 3 can be performed to pattern the second vertically alternating sequence (232, 242) and to provide additional stepped surfaces in each terrace region 210. Second retro-stepped dielectric material portions 265 can be formed on the additional stepped surfaces in the terrace regions 210.

Figure 11A:
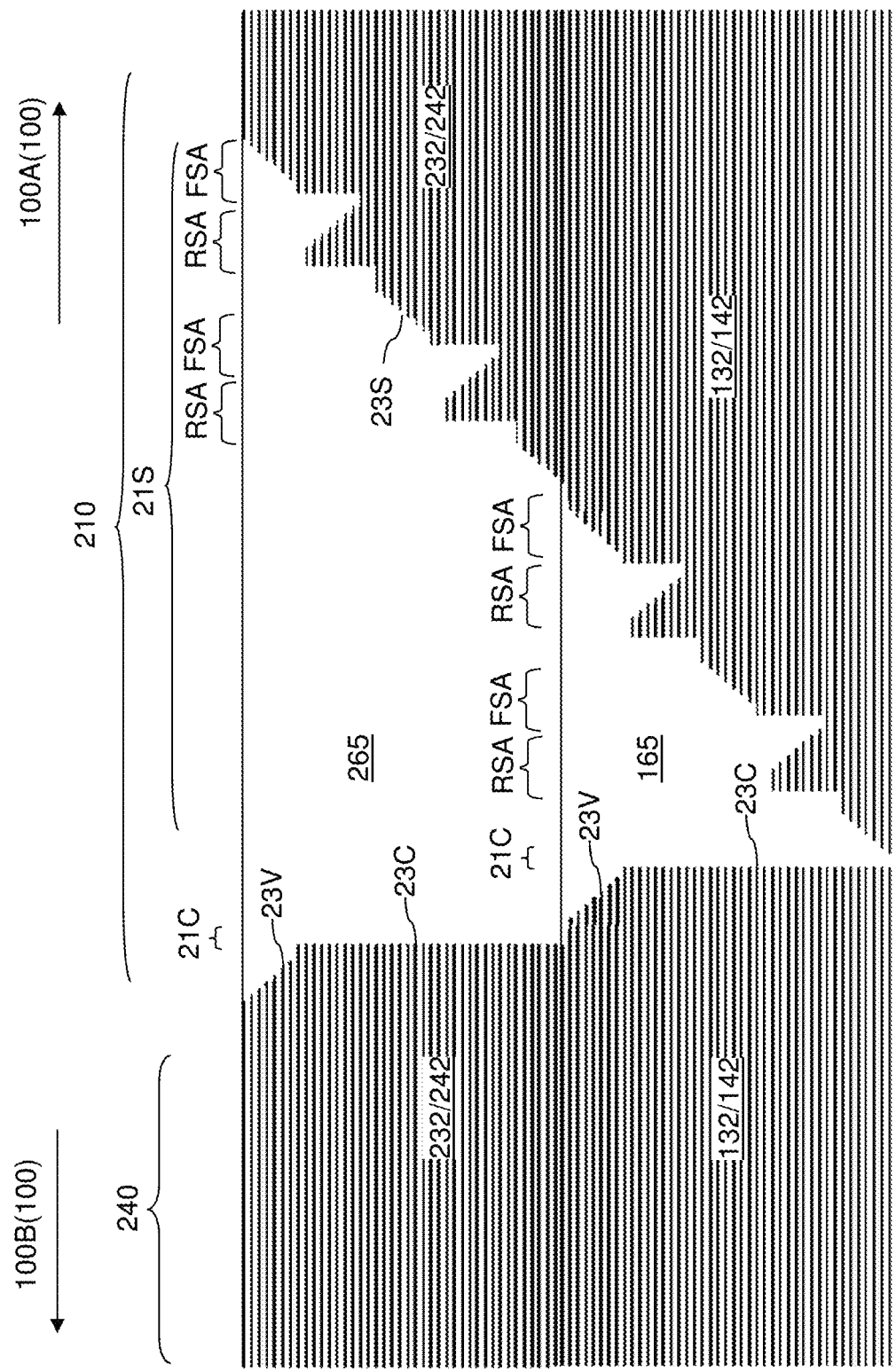
FIG. 11A is a vertical cross-sectional view of the second configuration of the exemplary structure along a vertical plane that includes a terrace region after formation of additional stepped surfaces on the second vertically alternating sequence and second dielectric material portions according to an embodiment of the present disclosure.
Figure 11B:
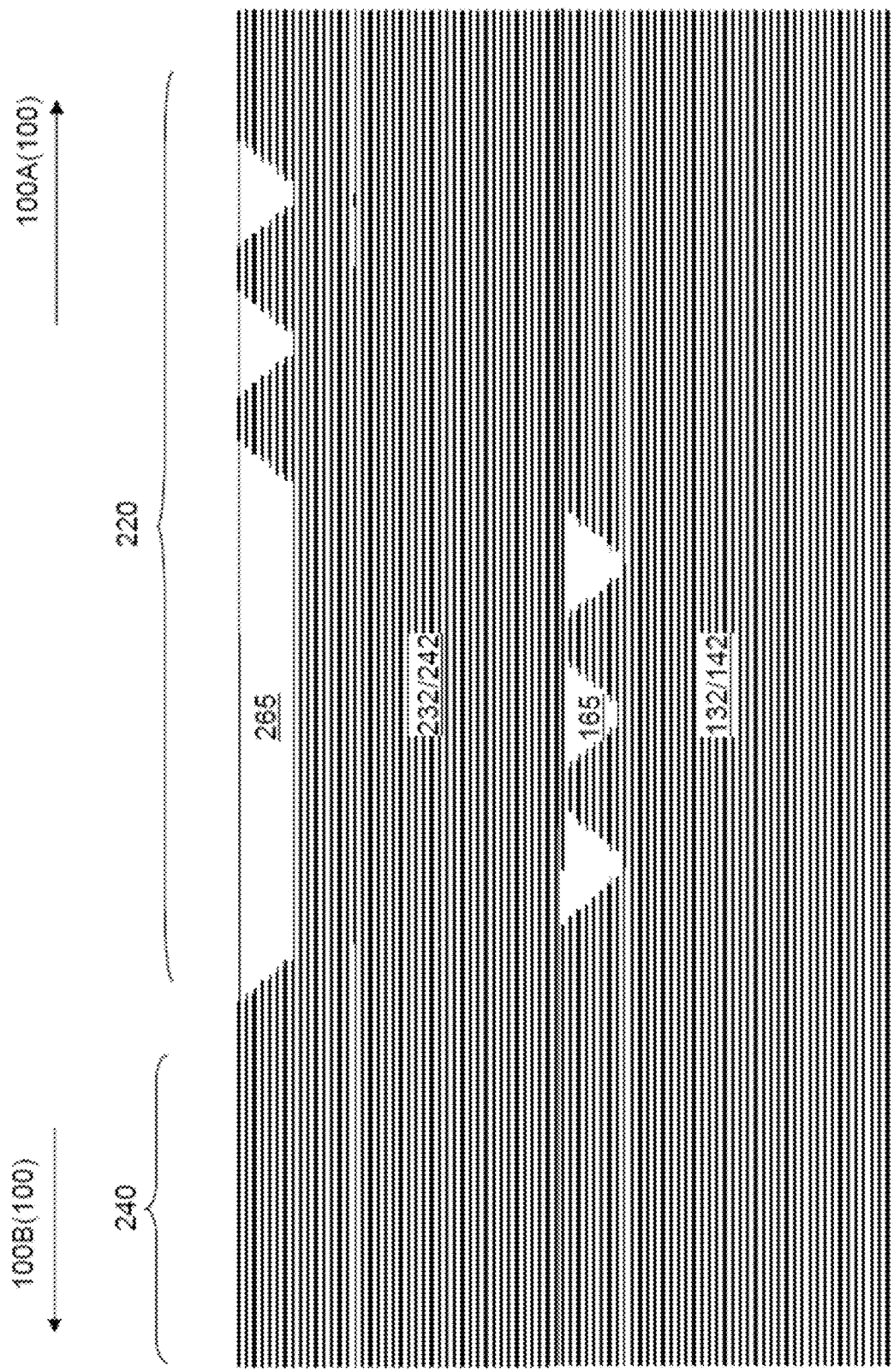
FIG. 11B is a vertical cross-sectional view of the second configuration of the exemplary structure along a vertical plane that includes an array connection region at the processing step of FIG. 10A.

Referring to FIGS. 11A and 11B, the second configuration of the exemplary structure is illustrated after the second vertically alternating sequence (232, 242) are patterned. Thus, in case the second configuration is employed instead of the first configuration, the processing steps of FIGS. 5A-5E, 6A-6D and 7A, and 7B can be performed to pattern the second vertically alternating sequence (232, 242) and to provide additional stepped surfaces in each terrace region 210. A second-tier structure including a second vertically alternating sequence (232, 242) and second retro-stepped dielectric material portions 265 is formed. The stepped surfaces in the second-tier structure are herein referred to as second stepped surfaces.

Generally, additional multiple sets of stepped surfaces can be formed on each additional vertically alternating sequence in case at least one additional vertical alternating sequence of additional insulating layers and additional spacer material layers is employed. An additional set of layer patterning processing steps can be iteratively performed at least twice. The additional set of layer patterning processing steps can comprise an additional patterned photoresist material layer formation step in which a respective additional patterned photoresist material layer with a respective array of openings therein is formed over the additional vertically alternating sequence, and an additional pattern transfer step in which a pattern in the respective additional patterned photoresist material layer is transferred through a respective number of layers within the additional vertically alternating sequence. An additional dielectric material portion can be formed on each of the additional multiple sets of stepped surfaces of the additional vertically alternating sequence.

While the present disclosure is described employing an embodiment in which two vertically alternating sequences of insulating layers and spacer material layers are employed, embodiments are expressly contemplated herein in which a single vertically alternating sequence or three or more vertically alternating sequences are employed.

Figure 12:
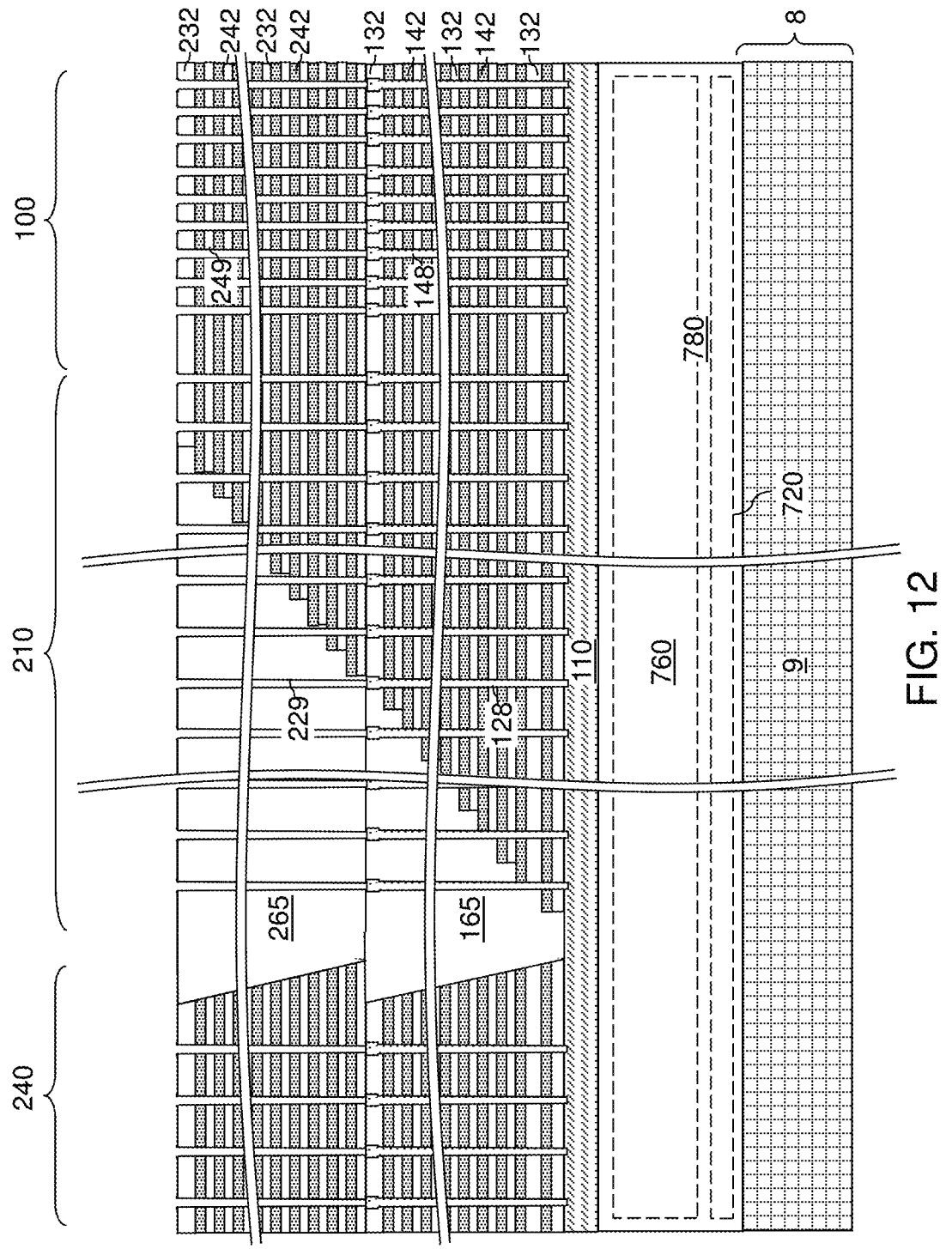
FIG. 12 is a vertical cross-sectional view of the exemplary structure after formation of second-tier openings through the second vertically alternating sequence according to an embodiment of the present disclosure.

Referring to FIG. 12, various second-tier openings may be formed through the second-tier structure (232, 242, 265). A photoresist layer (not shown) may be applied over the second-tier structure, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265) by a second anisotropic etch process to form various second-tier openings concurrently, i.e., during the second anisotropic etch process. The various second-tier openings may include second-tier memory openings 249 and second-tier support openings 229. The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, a subset of the second-tier support openings 229 may be formed through a horizontal surface within the second stepped surfaces, which include the interfacial surfaces between the second vertically alternating sequence (232, 242) and the second retro-stepped dielectric material portion 265.

Referring to FIG. 13A, the sacrificial first-tier fill material of the sacrificial first-tier opening fill portions (148, 128) may be removed using an etch process that etches the sacrificial first-tier fill material selective to the materials of the first and second insulating layers (132, 232) and the first and second sacrificial material layers (142, 242). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening, is formed in each combination of a second-tier support openings and a volume from which a sacrificial first-tier support opening fill portion 128 is removed. The inter-tier memory opening 49 extends through the first-tier structure and the second-tier structure.

Referring to FIG. 13B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 13C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second insulating layer 232 may be removed, for example, by a recess etch. The recess etch continues until top surfaces of the remaining portions of the dielectric core layer are recessed to a height between the top and bottom surfaces of the top second insulating cap layer 232. Each remaining portion of the dielectric core layer constitutes a dielectric core 62.

Figure 14:
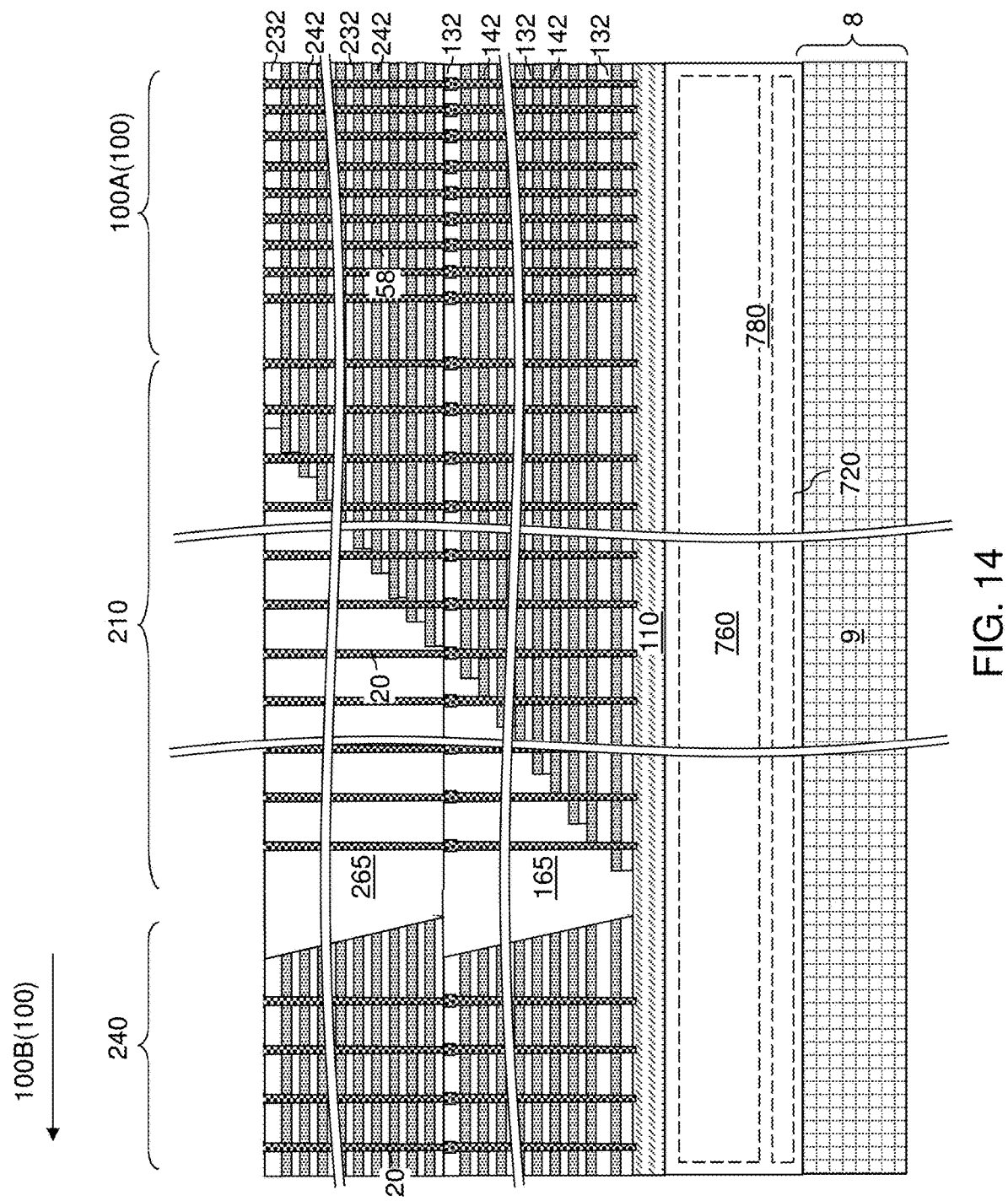
FIG. 14 is a vertical cross-sectional view of the exemplary structure after formation of memory opening fill structures and support pillar structures according to an embodiment of the present disclosure.

Referring to FIGS. 13D and 14, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the top second insulating layer 232 may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58.

Each inter-tier support opening can be filled with a respective set of material portions having the same material composition as a corresponding component in a memory opening fill structure 58. Each set of material portions filling an inter-tier support opening is herein referred to as a support pillar structure 20. It is noted that memory opening fill structures 58 located in the memory array regions 100 are illustrated in FIG. 1B and the support pillar structures 20 are not illustrated in FIGS. 1A-1F for the purpose of clarity. The semiconductor material layer 110, the first-tier structure (132, 142, 165), the second-tier structure (232, 242, 265), the memory opening fill structures 58, and the support pillar structures 20 collectively constitute a memory-level assembly.

Figure 15:
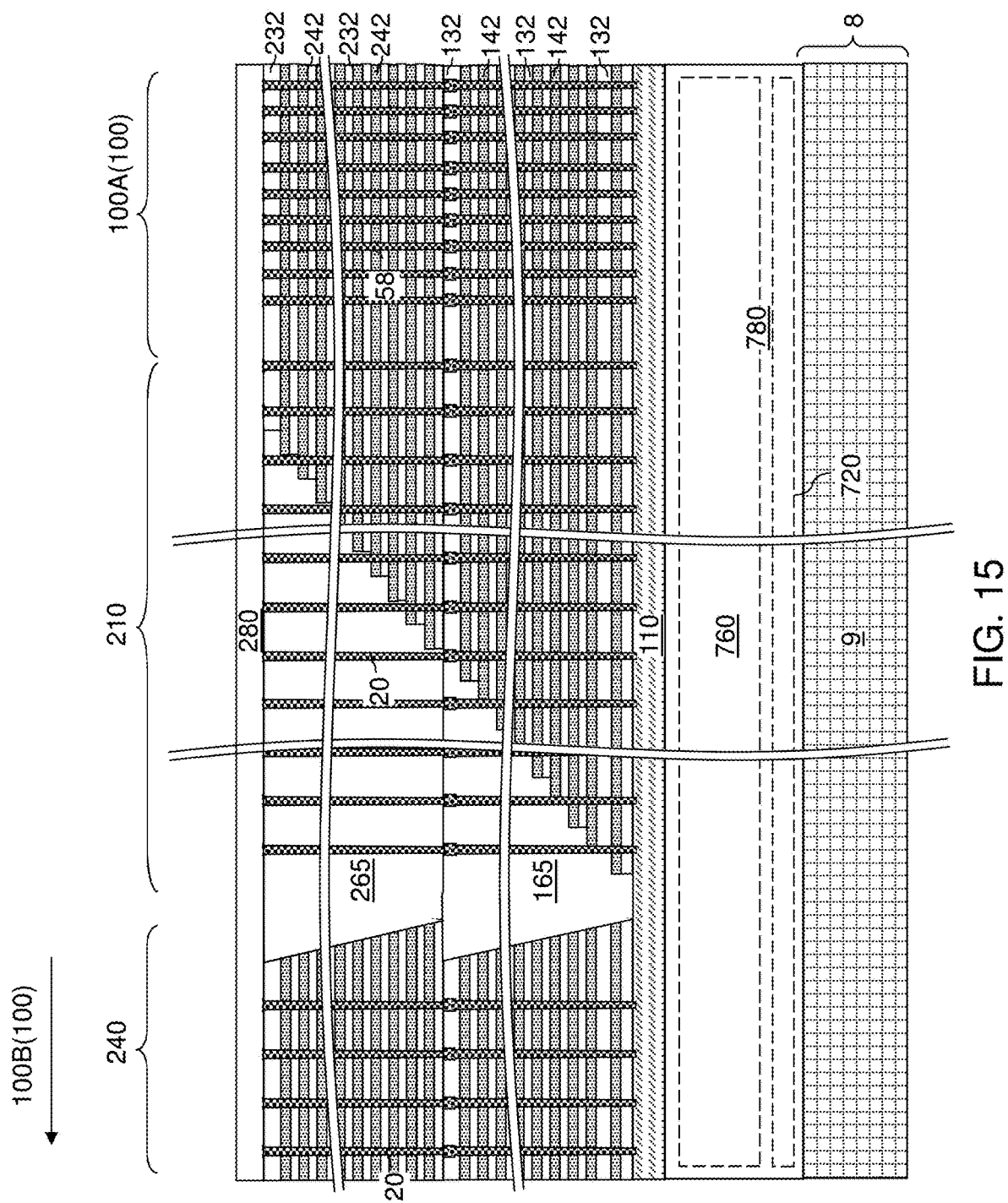
FIG. 15 is a vertical cross-sectional view of the exemplary structure after formation of a contact level dielectric layer according to an embodiment of the present disclosure.

Referring to FIG. 15, a contact-level dielectric layer 280 may be formed over the second-tier structure (232, 242, 265). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the dielectric wall structures 76 illustrated in FIGS. 1B-1F. The linear openings in the photoresist layer can be formed within areas in which memory opening fill structures 58 or the support pillar structures 20 are not present.

Line trenches (not expressly shown) may be formed by transferring the pattern in the photoresist layer (not shown) through the contact-level dielectric layer 280, the second-tier structure (232, 242, 265), and the first-tier structure (132, 142, 165), and into the semiconductor material layer 110. The pattern of the line trenches can be identical to the pattern of the dielectric wall structures 76 illustrated in FIGS. 1B-1F. Portions of the contact-level dielectric layer 280, the second-tier structure (232, 242, 265), the first-tier structure (132, 142, 165), and the semiconductor material layer 110 that underlie the linear openings in the photoresist layer may be removed by an anisotropic etch process to form the line trenches. In one embodiment, the line trenches may be formed between clusters of memory stack structures 55. The clusters of the memory stack structures 55 may be laterally spaced apart along the second horizontal direction hd2 by the line trenches.

Each vertically alternating sequence {(132, 142), (232, 242)} is divided into a plurality of alternating stacks of insulating layers (132 or 232) and spacer material layers (such as the sacrificial material layers (142, 242)) (e.g., memory blocks) by the line trenches. Each line trench can laterally extend along the first horizontal direction hd1 through am inter-array region 200 and a pair of memory array regions 100 that are adjoined to inter-array region 200. Further, each line trench can vertically extend through an entire thickness of the vertically alternating sequences {(132, 142), (232, 242)}. Each patterned portion of the first vertically alternating sequence located between a neighboring pair of line trenches constitutes a first alternating stack of first insulating layers 132 and first spacer material layers (such as first sacrificial material layers 142). Each patterned portion of the second vertically alternating sequence located between a neighboring pair of line trenches constitutes a second alternating stack of second insulating layers 232 and second spacer material layers (such as second sacrificial material layers 242). A plurality of alternating stacks of insulating layers (132 or 232) and spacer material layers (which may be first sacrificial material layers 142 or second sacrificial material layers 242) can be formed. In one embodiment, each alternating stack of the plurality of alternating stacks includes a respective one of the staircase regions 21S and a respective one of the cliff regions 21C.

Figure 16:
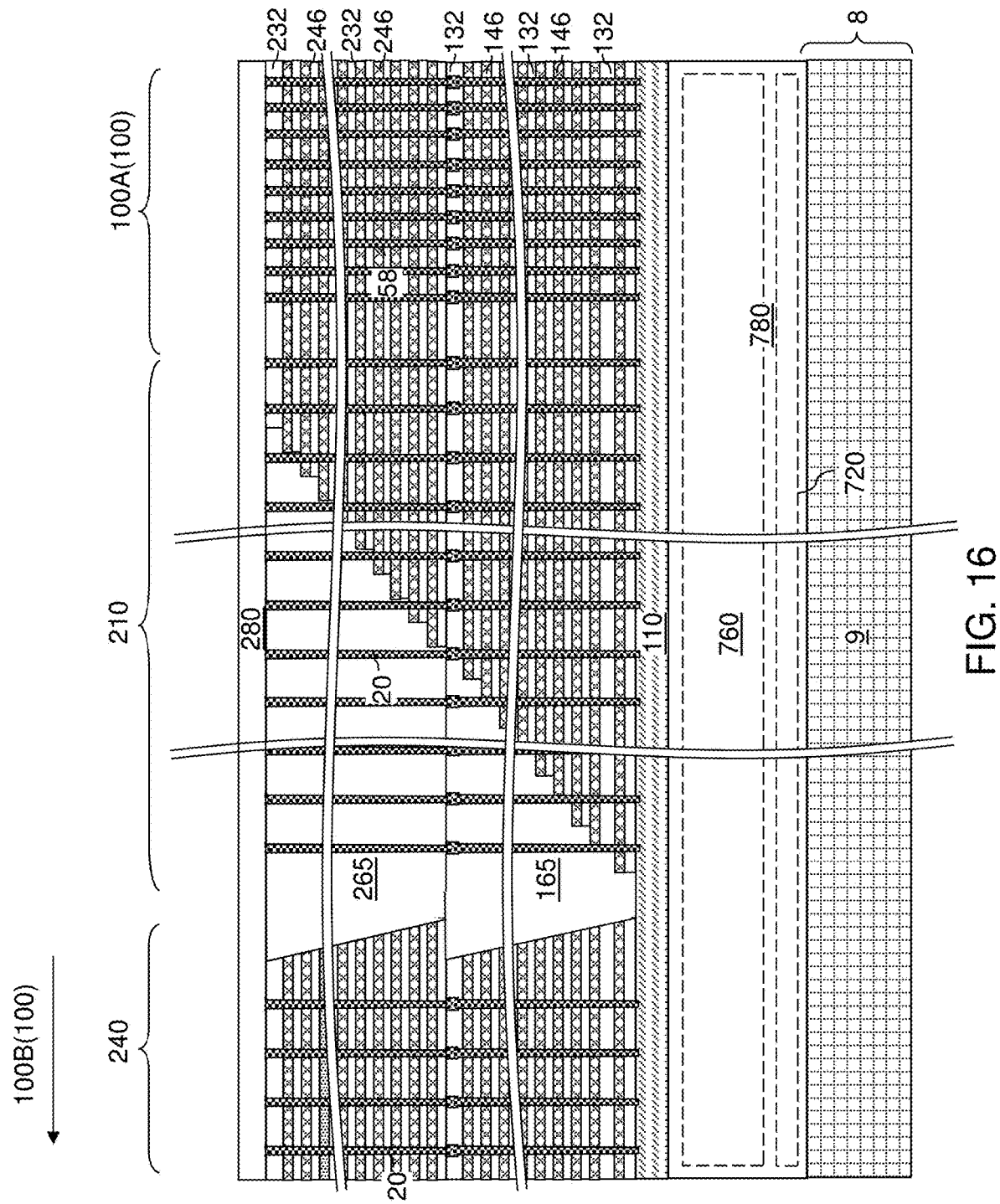
FIG. 16 is a vertical cross-sectional view of the exemplary structure after formation of electrically conductive layers according to an embodiment of the present disclosure.

Referring to FIG. 16, if the spacer material layers comprise sacrificial material layers (142, 242), then the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the line trenches, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the line trench. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses are formed in volumes from which the sacrificial material layers (142, 242) are removed. The backside recesses include first backside recesses that are formed in volumes from which the first sacrificial material layers 142 are removed and second backside recesses that are formed in volumes from which the second sacrificial material layers 242 are removed. Each of the backside recesses may be a laterally extending cavity having a lateral dimension that is greater than the vertical extent of the cavity. In other words, the lateral dimension of each of the backside recesses may be greater than the height of the respective backside recess. A plurality of backside recesses may be formed in the volumes from which the material of the sacrificial material layers (142, 242) is removed. Each of the backside recesses may extend substantially parallel to the top surface of the substrate semiconductor layer 9. A backside recess may be vertically bounded by a top surface of an underlying insulating layer (132, 232) and a bottom surface of an overlying insulating layer (132, 232). In one embodiment, each of the backside recesses may have a uniform height throughout.

An optional backside blocking dielectric layer (not shown) may be optionally deposited in the backside recesses and the line trenches and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses, on the sidewalls of the line trenches, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses may be a combination of titanium nitride layer and a tungsten fill material.

Electrically conductive layers (146, 246) may be formed in the backside recesses by deposition of the at least one conductive material. A plurality of first electrically conductive layers 146 may be formed in the plurality of first backside recesses, a plurality of second electrically conductive layers 246 may be formed in the plurality of second backside recesses, and a continuous metallic material layer (not shown) may be formed on the sidewalls of each line trench and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each line trench that is not filled with the continuous metallic material layer.

Residual conductive material may be removed from inside the line trenches. Specifically, the deposited metallic material of the continuous metallic material layer may be etched back from the sidewalls of each line trench and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective line trench. The line trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

A dielectric material such as silicon oxide may be conformally deposited in the line trenches by a conformal deposition process. Each portion of the deposited dielectric material that fills a line trench constitutes a dielectric wall structure 76. The dielectric wall structures 76 can be arranged in a configuration illustrated in FIGS. 1B-1F.

Figure 17:
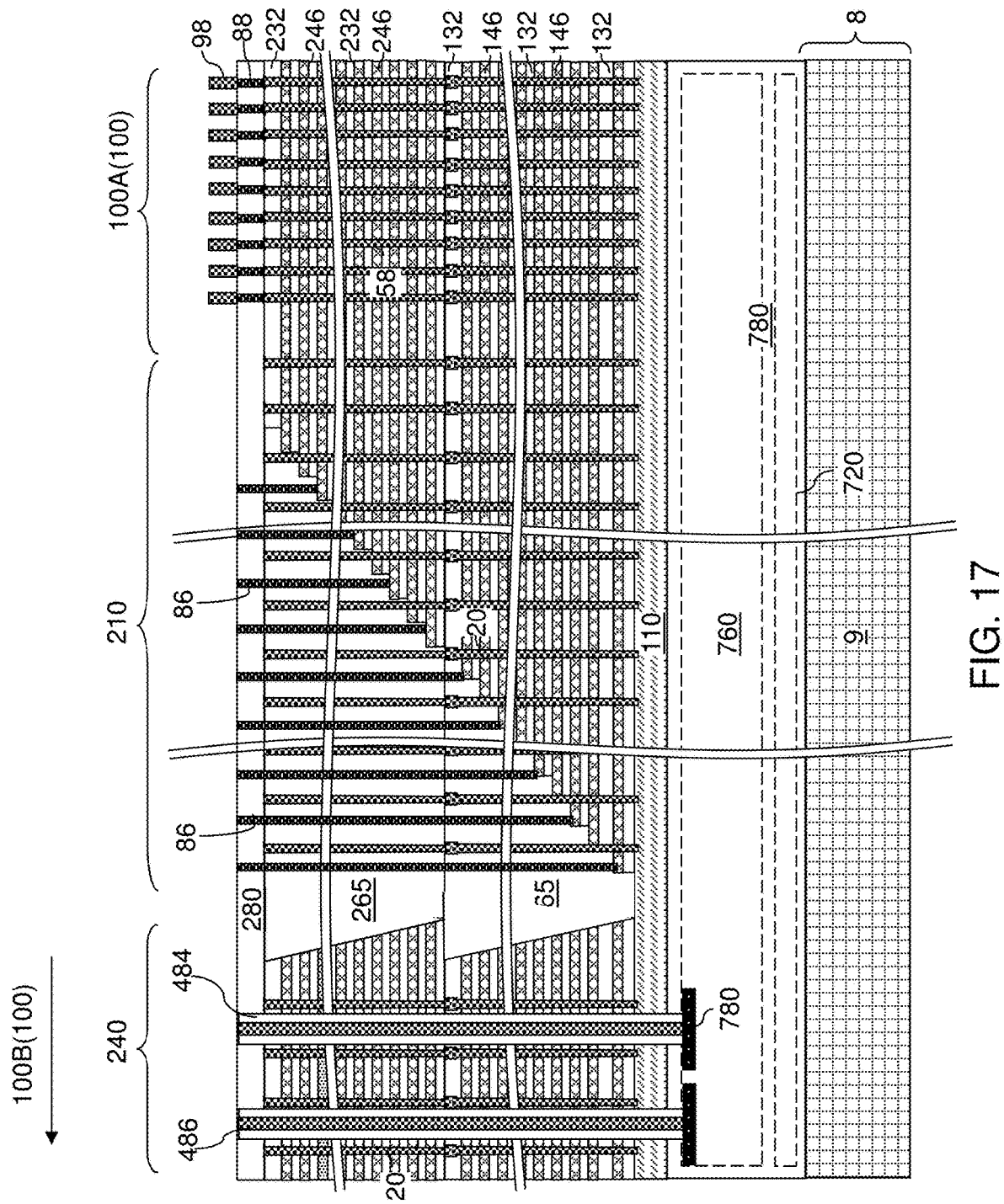
FIG. 17 is a vertical cross-sectional view of the exemplary structure after formation of various contact via structures according to an embodiment of the present disclosure.

Referring to FIG. 17, various contact via structures (88, 86, 486) can be formed through the contact-level dielectric layer 280 and optionally through underlying material portions onto a respective underlying conductive structure. The various contact via structures (88, 86, 486) can include drain contact via structures (e.g., drain electrodes) 88 that are formed in the memory array regions 100 through the contact-level dielectric layer 280 on a top surface of a respective drain region 63. The various contact via structures (88, 86, 486) can include word line contact via structures 86 that are formed in the terrace region 210 through the contact-level dielectric layer 280 and at least one retro-stepped dielectric material portion (165, 265) onto a respective one of the electrically conductive layers (146, 246). Further, laterally-isolated vertical interconnection structures (484, 486) can be formed through the alternating stacks (132, 146, 232, 246) in the vertical interconnection via regions 240. Each laterally-isolated vertical interconnection structures (484, 486) can include a through-memory-level conductive via structure 486 and a tubular insulating spacer 484 that laterally surrounds the conductive via structure 486. Each through-memory-level conductive via structure 486 can contact a respective one of the lower-level metal interconnect structure 780 embedded within the lower-level dielectric material layers 760. Bit lines 98 are then formed in electrical contact with the drain contact via structures 88. A source region or source line may be formed in the semiconductor material layer 110 or above the semiconductor material layer 110 and electrically connected to the semiconductor devices 700 in a peripheral region (not shown).

Figure 18:
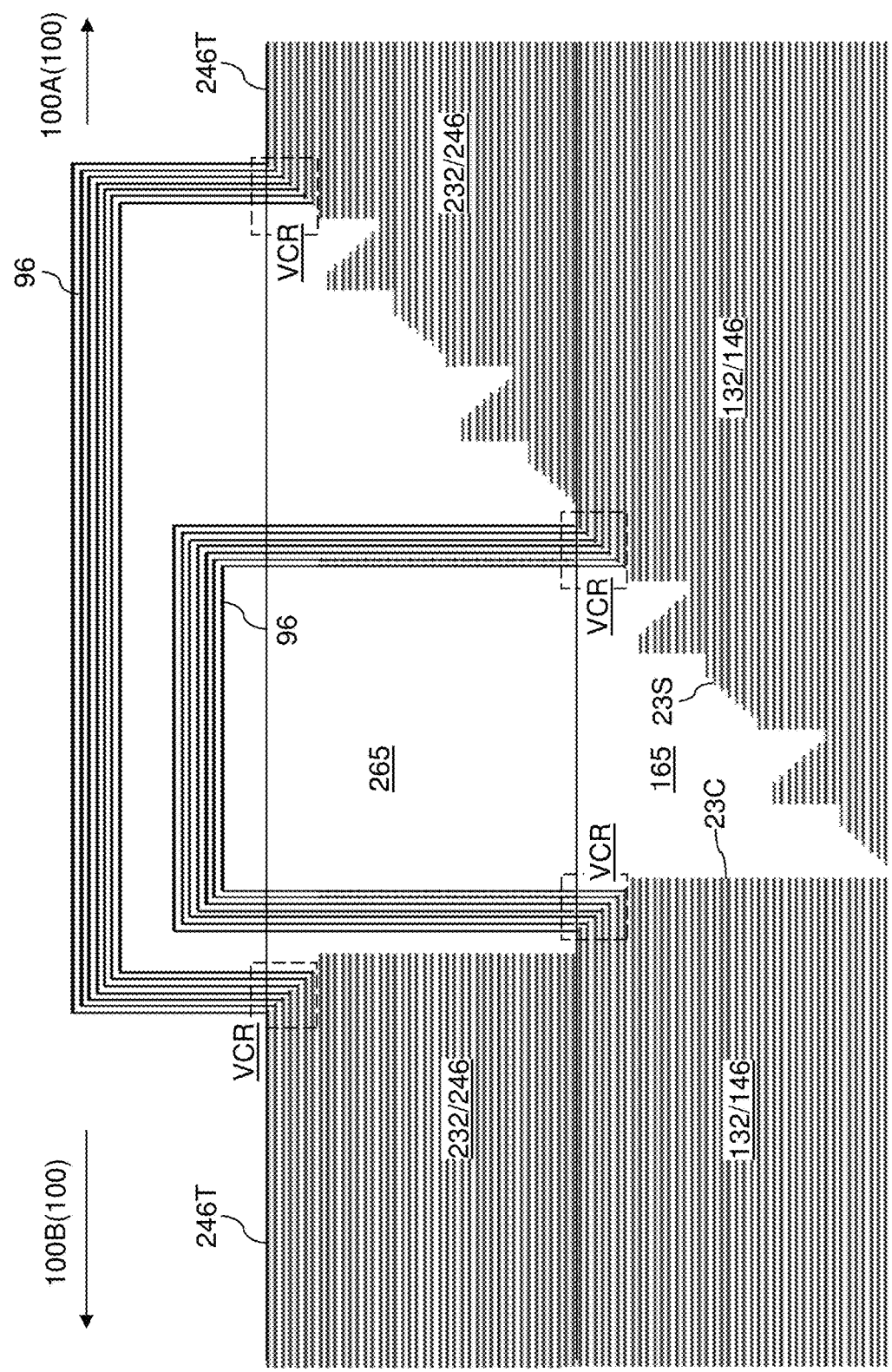
FIG. 18 is a vertical cross-sectional view of the second configuration of the exemplary structure after formation of contact via structures and metal interconnect structures that provide interconnection between the first memory array region and the second memory array region according to an embodiment of the present disclosure.

Referring to FIG. 18, a vertical cross-sectional view of the second configuration of the exemplary structure is illustrated after formation of metal interconnect structures 96 which extend in both the vertical and horizontal directions over the terrace region 210 adjacent to the array interconnection region 220. The metal interconnect structures 96 are connected to each electrically conductive layer (e.g., word line (146, 246) in the respective via contact region (VCR). Thus, the metal interconnect structures 96 electrically connect upper set of the upper electrically conductive layers (e.g., word lines) that do not extend through the array interconnection region 220 (i.e., which are cut in the array interconnection region 220 during the patterning steps of FIGS. 7A and 7B). Therefore, the metal interconnect structures 96 in FIG. 18 provide interconnection between the respective upper word lines in the first memory array region 100A and the second memory array region 100B in the same vertical levels.

At least one electrically conductive layer (146 or 246) including a topmost electrically conductive layer of each alternating stack {(132, 146), (232, 246)} is disconnected into discrete portions located in the first memory array region 100A and in the second memory array region 100B, and does not extend across the array interconnection region 220 along the first horizontal direction hd1 due to stepped surfaces that can be formed, for example, employing the processing steps of FIGS. 7A and 7B. A portion of each such disconnected electrically conductive layer (146 or 246) (including the topmost electrically conductive layer) in the first memory array region 100A and a portion of each such disconnected electrically conductive layer (146 or 246) (including the topmost electrically conductive layer) in the second memory array region 100B can be electrically connected using the metal interconnect structure 96 which extend at least partially in the vertical direction perpendicular to the top surface of the substrate.

In one embodiment shown in FIG. 18, the method of an embodiment of the present disclosure includes forming a metal interconnect structure 96 which electrically connects a portion of a topmost electrically conductive layer 246T in the first memory array region 100A and a portion of a topmost electrically conductive layer 246T in the second memory array region 100B, and which extends above a horizontal plane of the topmost electrically conductive layer 246 in the first memory array region 100A and a portion of a topmost electrically conductive layer 246T in the second memory array region 100B.

Thus, the upper electrically conductive layers (146, 246) (including the topmost electrically conductive layer 246T) in each alternating stack in at least one of the memory blocks (e.g., B2 and B3 in FIG. 7B) are connected between the first and second memory array regions (100A, 100B) by the respective metal interconnect structures 96. Each respective metal interconnect structure 96 extend over the terrace region 210 above the horizontal plane of the respective electrically conductive layers (146, 246) located in the first and second memory array regions (100A, 100B) which the respective metal interconnect structure 96 electrically connects to each other. The lower electrically conductive layers (146, 246) in each alternating stack in each memory block continuously extend through the array interconnection region (e.g., "bridge" region) 220 in the same horizontal plane between the first and second memory array regions (100A, 100B). Furthermore, in one embodiment, the upper electrically conductive layers (146, 246) in each alternating stack in some other memory blocks (e.g., B1, B4) continuously extend through the array interconnection region (e.g., "bridge" region) 220 in the same horizontal plane between the first and second memory array regions (100A, 100B).

In one embodiment shown in FIGS. 6A-6D, a portion of each respective lower electrically conductive layer (146, 246) in the first memory array region 100A and a portion of each respective lower electrically conductive layer (146, 246) in the second memory array region 100B are electrically connected by a respective electrically conductive region (146, 246) extending in an array interconnection region 220 in a horizontal plane of each respective lower electrically conductive layer (146, 246) in the first memory array region 100A and each respective lower electrically conductive layer (146, 246) in the second memory array region 100B. The array interconnection region 220 is adjoined to, and is laterally offset along a second horizontal direction hd2 from, the respective one of the staircase regions 21S and the respective one of the cliff regions 23C. The electrically conductive regions (146, 246) extending in an array interconnection region 220 comprise portions of lower electrically conductive layers located in the array interconnection region 220 which provide electrically conductive paths between the first memory array region 110A and the second memory array region 100B.

In contrast, as shown in FIG. 18, the topmost electrically conductive layer 246T is disconnected into discrete portions located in the first memory array region 100A and in the second memory array region 100B and does not extend through the array interconnection region 220. The stepped surfaces 23V of the via contact region VCR have a greater taper than the cliff region surfaces 23C, and the metal interconnect structure 96 contacts the topmost electrically conductive layer 246T in the via contact region VCR.

Preferably, but not necessarily, a hard mask (e.g., a dielectric mask other than a photoresist) is not used during the step of forming multiple sets of stepped surfaces in terrace regions 210.

Referring to FIGS. 6A-6D, 11A-11B and 18 and according to the second embodiment of the present disclosure, a three-dimensional memory device is provided. The three-dimensional memory device can include alternating stacks {(132, 146) and/or (232, 246)} of insulating layers (132 and/or 232) and electrically conductive layers (146 and/or 246) located over a substrate 8, wherein the alternating stacks {(132, 146) and/or (232, 246)} are laterally spaced apart among one another by line trenches that laterally extend along a first horizontal direction hd1; and memory stack structures 55 extending through memory array regions 100 of the alternating stacks {(132, 146) and/or (232, 246)} in which all layers of a respective one of the alternating stacks {(132, 146) and/or (232, 246)} are present, wherein each alternating stack {(132, 146) and/or (232, 246)} comprises: a first memory array region 100A including a respective first subset of the memory stack structures 55; a second memory array region 100B including a respective second subset of the memory stack structures 55 and laterally spaced from the first memory array region 100A along a first horizontal direction hd1; and a terrace region 210 including a set of stepped surfaces and located between the first memory array region 100A and the second memory array region 100B. The set of stepped surfaces comprises at least one forward staircase area FSA in which a vertical step of an overlying electrically conductive layer (146 or 246) is more proximal to the first memory array region 100A than a vertical step of an underlying electrically conductive layer (146 or 246) is to the first memory array region 100A for a vertically neighboring pair of electrically conductive layers (146 or 246). The set of stepped surfaces comprises at least one reverse staircase area RSA in which a vertical step of an overlying electrically conductive layer (146 or 246) is less proximal to the first memory array region 100A than a vertical step of an underlying electrically conductive layer (146 or 246) is to the first memory array region 100A for a vertically neighboring pair of electrically conductive layers (146 or 246).

Each memory stack structure 55 comprises a memory film 50 and a vertical semiconductor channel 60. Each terrace region 210 can include a respective staircase region 21S and a respective cliff region 21C. The respective cliff region 21C and the respective staircase region 21S can be laterally spaced apart along a first horizontal direction hd1. In one embodiment, the first memory array region 100A can be more proximal to the respective one of the staircase regions 21S than to the respective one of the cliff regions 21C. The second memory array region 100B can be more proximal to the respective one of the cliff regions 21C than to the respective one of the staircase regions 21S. An array interconnection region 220 can be adjoined to, and can be laterally offset along a second horizontal direction hd2 from, the respective one of the staircase regions 21S and the respective one of the cliff regions 21C. Portions of the electrically conductive layers (146 and/or 246) in the array interconnection region 220 provide electrically conductive paths between the first memory array region 100A and the second memory array region 100B.

In one embodiment shown in FIG. 18, first and second portions of each lower electrically conductive layer (146 and/or 246) located in the respective first and second memory array regions (100A, 100B) are electrically connected by a third portion of each respective lower electrically conductive layer (146 and/or 246) located in the array interconnection region 220 in a horizontal plane of the first and second portions of each lower electrically conductive layer (146 and/or 246). In contrast, first and second portions of a topmost electrically conductive layer 246T located in the respective first and second memory array regions (100A, 100B) are electrically connected by a metal interconnect structure 96 which extends over the terrace region 210 above a horizontal plane of the first and second portions of the topmost electrically conductive layer 246T.

In one embodiment, the array interconnection region 220 can contact a respective dielectric material portion (such as a first retro-stepped dielectric material portion 165 and/or a second retro-stepped dielectric material portion 265) at an additional cliff region as illustrated in FIG. 1D. An average lateral spacing between neighboring pairs of vertical steps along the second horizontal direction hd2 is less than the sum of the average thickness of the insulating layers (132 and/or 232) and the average thickness of the electrically conductive layers (146 and/or 246).

In one embodiment, each set of stepped surfaces in a respective terrace region 200 comprises: staircase region surfaces located in a respective staircase region 21S in which an average lateral spacing between neighboring pairs of vertical steps is greater than a sum of an average thickness of the insulating layers (132 and/or 232) and an average thickness of the electrically conductive layers (146 and/or 246); and cliff region surfaces 23C located in a respective cliff region 21C that is adjoined to a periphery of the respective staircase region 21S, wherein vertical steps of the cliff region surfaces 23C have an average lateral spacing between neighboring pairs of vertical steps that is less than the sum of the average thickness of the insulating layers (132 and/or 232) and the average thickness of the electrically conductive layers (146 and/or 246).

In one embodiment, the respective cliff region 21C and the respective staircase region 21S are laterally spaced apart along the first horizontal direction hd1; and a lateral extent of the respective staircase region 21S along the first horizontal direction hd1 is at least five times a lateral extent of the respective cliff region 21C.

In one embodiment, each set of stepped surfaces in the respective terrace region 210 is contacted by a respective dielectric material portion (such as a first retro-stepped dielectric material portion 165 or a second retro-stepped dielectric material portion 265); and the respective dielectric material portion contacts sidewalls of the portions of the electrically conductive layers (146 or 246) in the array interconnection region 220, the sidewalls laterally extending along the first horizontal direction hd1.

Referring to FIG. 18 and according to various embodiments of the present disclosure, a three-dimensional memory device is provided, which comprises: alternating stacks of insulating layers (132 and/or 232) and electrically conductive layers (146 and/or 246) located over a substrate 8, wherein the alternating stacks {(132, 146) and/or (232, 246)} are laterally spaced apart among one another by line trenches that laterally extend along a first horizontal direction hd1; and memory stack structures 55 extending through memory array regions 100 of the alternating stacks {(132, 146) and/or (232, 246)} in which all layers of a respective one of the alternating stacks {(132, 146) and/or (232, 246)} are present. Each alternating stack {(132, 146) and/or (232, 246)} comprises: a first memory array region 100A including a respective first subset of the memory stack structures 55; a second memory array region 100B including a respective second subset of the memory stack structures 55 and laterally spaced from the first memory array region 100A along a first horizontal direction hd1; a terrace region 210 including a set of stepped surfaces and located between the first memory array region 100A and the second memory array region 100B; and an array interconnection region 220 adjoined to, and is laterally offset along a second horizontal direction hd2 from, the terrace region 210.

First and second portions of each lower electrically conductive layer (146, 246) located in the respective first and second memory array regions (100A, 100B) are electrically connected by a third portion of each respective lower electrically conductive layer (146, 246) located in the array interconnection region 220 in a horizontal plane of the first and second portions of each lower electrically conductive layer (146, 246). In contrast, first and second portions of a topmost electrically conductive layer 246T located in the respective first and second memory array regions (100A, 100B) are electrically connected by a metal interconnect structure 96 which extends over the terrace region 210 above a horizontal plane of the first and second portions of the topmost electrically conductive layer 246T.

The second alternating stack 100B contains a via contact region VCR located over a cliff region 21C surface 23C. Stepped surfaces 23V of the via contact region VCR have a greater taper than the cliff region surface 23C. The metal interconnect structure 96 contacts the topmost electrically conductive layer 246T in the via contact region VCR.

In one embodiment, the set of stepped surfaces comprises: staircase region surfaces located in a respective staircase region 21S in which an average lateral spacing between neighboring pairs of vertical steps is greater than a sum of an average thickness of the insulating layers (132 and/or 232) and an average thickness of the electrically conductive layers (146 and/or 246), and cliff region surfaces 23C located in a respective cliff region 21C that is adjoined to a periphery of the respective staircase region 21S, wherein vertical steps of the cliff region surfaces have an average lateral spacing between neighboring pairs of vertical steps that is less than the sum of the average thickness of the insulating layers (132 and/or 232) and the average thickness of the electrically conductive layers (146 and/or 246).

In one embodiment, the set of stepped surfaces comprises: at least one forward staircase area FSA in which a vertical step of an overlying electrically conductive layer (146 or 246) is more proximal to the first memory array region 100A than a vertical step of an underlying electrically conductive layer (146 or 246) is to the first memory array region 100A for a vertically neighboring pair of electrically conductive layers (146 or 246); and at least one reverse staircase area RSA in which a vertical step of an overlying electrically conductive layer (146 or 246) is less proximal to the first memory array region 100A than a vertical step of an underlying electrically conductive layer (146 or 246) is to the first memory array region 100A for a vertically neighboring pair of electrically conductive layers (146 or 246).

The various embodiments of the present disclosure can be employed to form stepped surfaces employing a set of patterned photoresist material layers. As such, use of a hard mask is unnecessary for patterning the stepped surfaces. The cliff regions 21C can be provided by overlapping edges of the patterned photoresist material layers in proximity among one another. Use of patterned photoresist material layers and elimination of a hard mask layer can reduce the processing cost for formation of the stepped surfaces, and the pattern fidelity of the stepped surfaces can be enhanced through use of the patterned photoresist material layers in lieu of one or more hard mask layers.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a three-dimensional memory device, comprising:
   forming a vertically alternating sequence of insulating layers and spacer material layers over a substrate, wherein the spacer material layers are formed as, or are subsequently replaced with, electrically conductive layers;
   forming multiple sets of stepped surfaces in terrace regions of the vertically alternating sequence by iteratively performing a set of layer patterning processing steps at least twice, wherein the set of layer patterning processing steps comprises a patterned photoresist material layer formation step in which a respective patterned photoresist material layer with a respective array of openings therein is formed over the vertically alternating sequence, and a pattern transfer step in which a pattern in the respective patterned photoresist material layer is transferred through a respective number of layers within the vertically alternating sequence;

forming a dielectric material portion on each of the multiple sets of stepped surfaces of the vertically alternating sequence in each of the terrace regions;

forming memory stack structures through memory array regions of the vertically alternating sequence in which all layers of the vertically alternating sequence are present; and forming a metal interconnect structure which electrically connects a portion of a topmost electrically conductive layer in the first memory array region and a portion of a topmost electrically conductive layer in the second memory array region, and which extends above a horizontal plane of the topmost electrically conductive layer in the first memory array region and the portion of the topmost electrically conductive layer in the second memory array region;

wherein:

a portion of each respective lower electrically conductive layer in the first memory array region and a portion of each respective lower electrically conductive layer in the second memory array region are electrically connected by a respective electrically conductive region extending in an array interconnection region in a horizontal plane of each respective lower electrically conductive layer in the first memory array region and each respective lower electrically conductive layer in the second memory array region;

a hard mask is not used during the step of forming multiple sets of stepped surfaces in terrace regions; and the topmost electrically conductive layer is disconnected into discrete portions located in the first memory array region and in the second memory array region and does not extend through the array interconnection region; and wherein each set of stepped surfaces of the multiple sets of stepped surfaces comprises:

staircase region surfaces formed in a respective staircase region in which an average lateral spacing between neighboring pairs of vertical steps is greater than a sum of an average thickness of the insulating layers and an average thickness of the spacer material layers;

cliff region surfaces formed in a respective cliff region that is adjoined to a periphery of the respective staircase region, wherein an average lateral spacing between neighboring pairs of vertical steps in the cliff region is less than the sum of the average thickness of the insulating layers and the average thickness of the spacer material layers; and a via contact region located over each cliff region surfaces.

2. The method of claim 1, wherein:

stepped surfaces of the via contact region have a greater taper than the cliff region surfaces;

the metal interconnect structure contacts the topmost electrically conductive layer in the via contact region;

the respective cliff region and the respective staircase region are laterally spaced apart along a first horizontal direction;

a lateral extent of the respective staircase region along the first horizontal direction is at least five times a lateral extent of the respective cliff region;

the array interconnection region is adjoined to, and is laterally offset along a second horizontal direction from, the respective one of the staircase regions and the respective one of the cliff regions; and the electrically conductive regions extending in an array interconnection region comprise portions of lower electrically conductive layers located in the array interconnection region which provide electrically conductive paths between the first memory array region and the second memory array region.

3. The method of claim 2, further comprising dividing the vertically alternating sequence into a plurality of alternating stacks by forming line trenches that extend along the first horizontal direction through an entire thickness of the vertically alternating sequence, wherein each alternating stack of the plurality of alternating stacks comprises a respective one of the staircase regions and a respective one of the cliff regions.

4. The method of claim 3, wherein each alternating stack comprises:

the first memory array region in which a respective first subset of the memory stack structures is formed and is more proximal to the respective one of the staircase regions than to the respective one of the cliff regions; and the second memory array region in which a respective second subset of the memory stack structures is formed and is more proximal to the respective one of the cliff regions than to the respective one of the staircase regions.

5. The method of claim 1, wherein the respective staircase region comprises:

at least one forward staircase area in which a vertical step of an overlying electrically conductive layer is more proximal to the first memory array region than a vertical step of an underlying electrically conductive layer is to the first memory array region for a vertically neighboring pair of electrically conductive layers; and at least one reverse staircase area in which a vertical step of an overlying electrically conductive layer is less proximal to the first memory array region than a vertical step of an underlying electrically conductive layer is to the first memory array region for a vertically neighboring pair of electrically conductive layers.

6. The method of claim 1, further comprising forming contact via structures directly on a top surface of a respective one of the electrically conductive layers in each of the staircase regions without forming any contact via structure in the cliff regions.

* * * * *